(12) United States Patent
Nakamura

(10) Patent No.: US 6,553,660 B2
(45) Date of Patent: Apr. 29, 2003

(54) ELECTRONIC DEVICE AND A METHOD OF MANUFACTURING THE SAME

(75) Inventor: Shigeru Nakamura, Ayase (JP)

(73) Assignees: Hitachi, Ltd., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 09/935,170

(22) Filed: Aug. 23, 2001

(65) Prior Publication Data

US 2002/0023342 A1 Feb. 28, 2002

(30) Foreign Application Priority Data

Aug. 31, 2000 (JP) ........................................ 2000-263864

(51) Int. Cl.[7] ................................................. H05K 3/34
(52) U.S. Cl. .............................. 29/840; 29/832; 29/837; 174/263
(58) Field of Search .......................... 29/825, 832, 840, 29/837; 174/263

(56) References Cited

U.S. PATENT DOCUMENTS

| | | | | |
|---|---|---|---|---|
| 4,761,881 A | * | 8/1988 | Bora et al. ........................ | 29/840 |
| 4,872,261 A | * | 10/1989 | Sanyai et al. ..................... | 29/840 |
| 4,916,805 A | * | 4/1990 | Ellrich et al. .................... | 29/840 |
| 4,941,255 A | * | 7/1990 | Bull ................................. | 29/840 |
| 4,982,376 A | * | 1/1991 | Megens et al. ................... | 29/840 |
| 5,155,904 A | * | 10/1992 | Majd ............................... | 29/840 |
| 5,337,467 A | * | 8/1994 | Kogure et al. ................... | 29/840 |
| 5,678,304 A | * | 10/1997 | Soper .............................. | 29/840 |
| 5,729,896 A | * | 3/1998 | Dalai et al. ...................... | 29/840 |
| 6,208,525 B1 | | 3/2001 | Imasu et al. | |

FOREIGN PATENT DOCUMENTS

| | | | |
|---|---|---|---|
| JP | 01-236693 | * | 9/1989 |
| JP | 10-270496 | | 10/1998 |

* cited by examiner

Primary Examiner—Carl J. Arbes
(74) Attorney, Agent, or Firm—Mattingly, Stanger & Malur, P.C.

(57) ABSTRACT

A method of manufacturing an electronic device including a first electronic component mounted on one main surface of a wiring board by being thermo-compression bonded by means of a thermo-compression bonding tool with an adhesive resin interposed between a first area of the one main surface of the wiring board and the first electronic component, and a second electronic component mounted on a second area different from the first area of the one main surface of the wiring board by melting a soldering paste material and higher than the first electronic component in post-mounting height, and wherein the first electronic component is mounted before the mounting of the second electronic component.

9 Claims, 21 Drawing Sheets

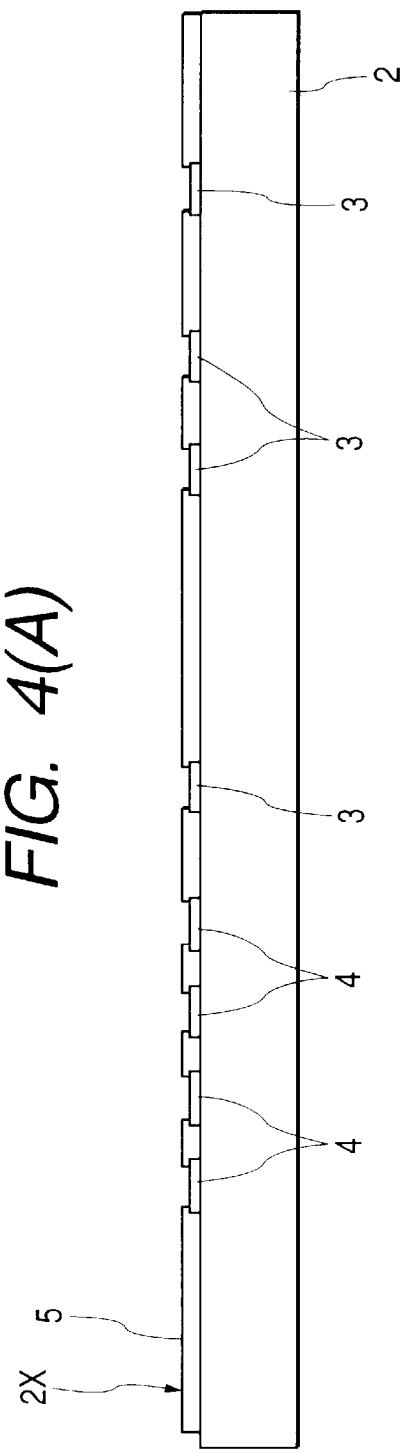
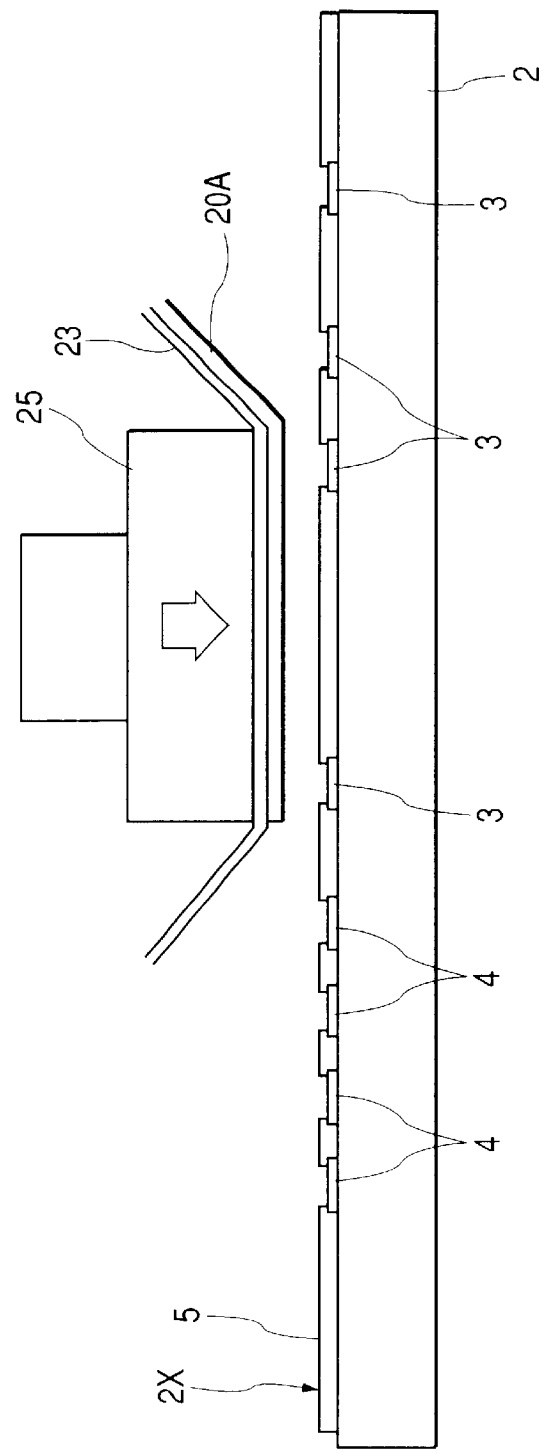

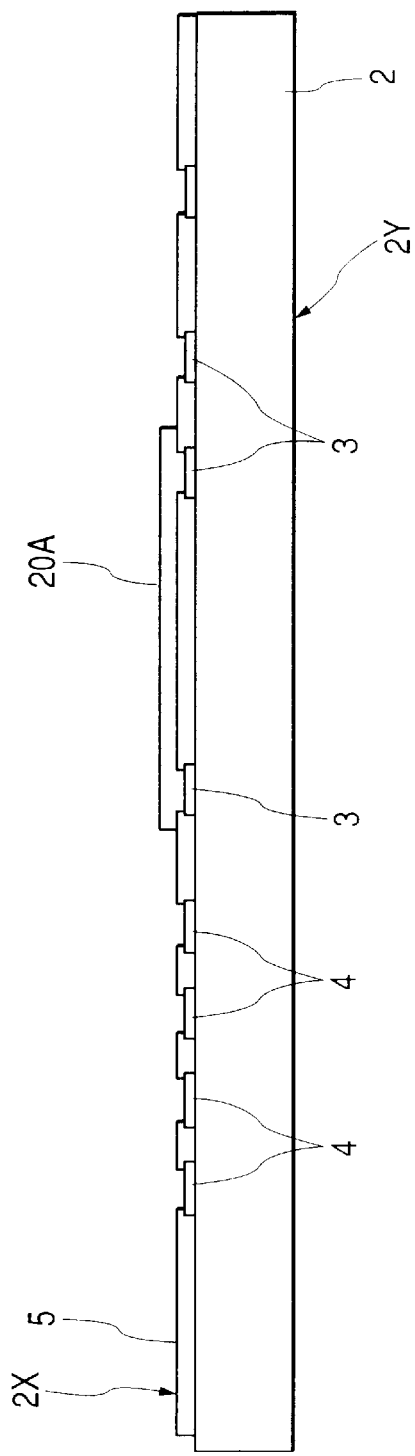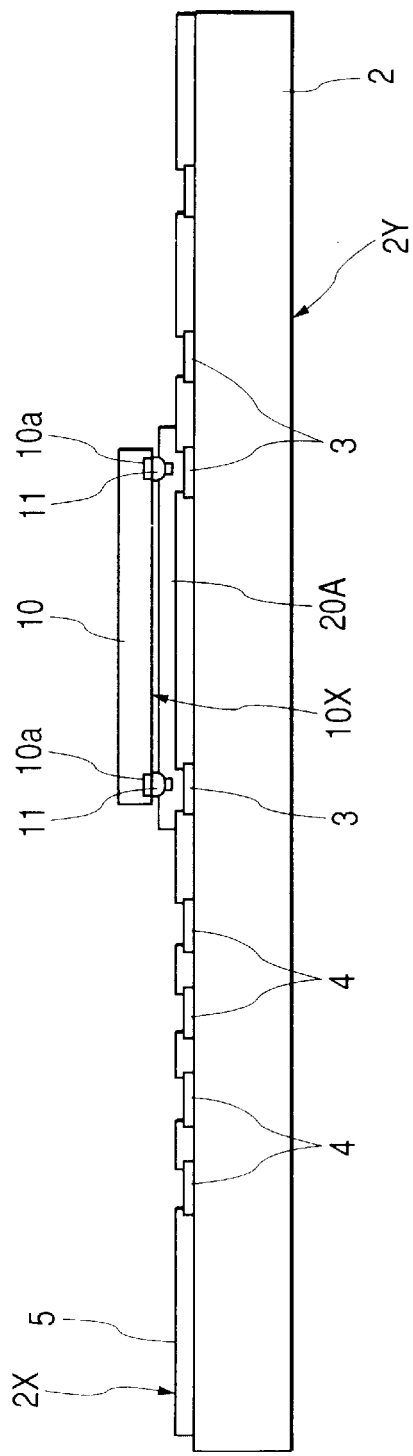

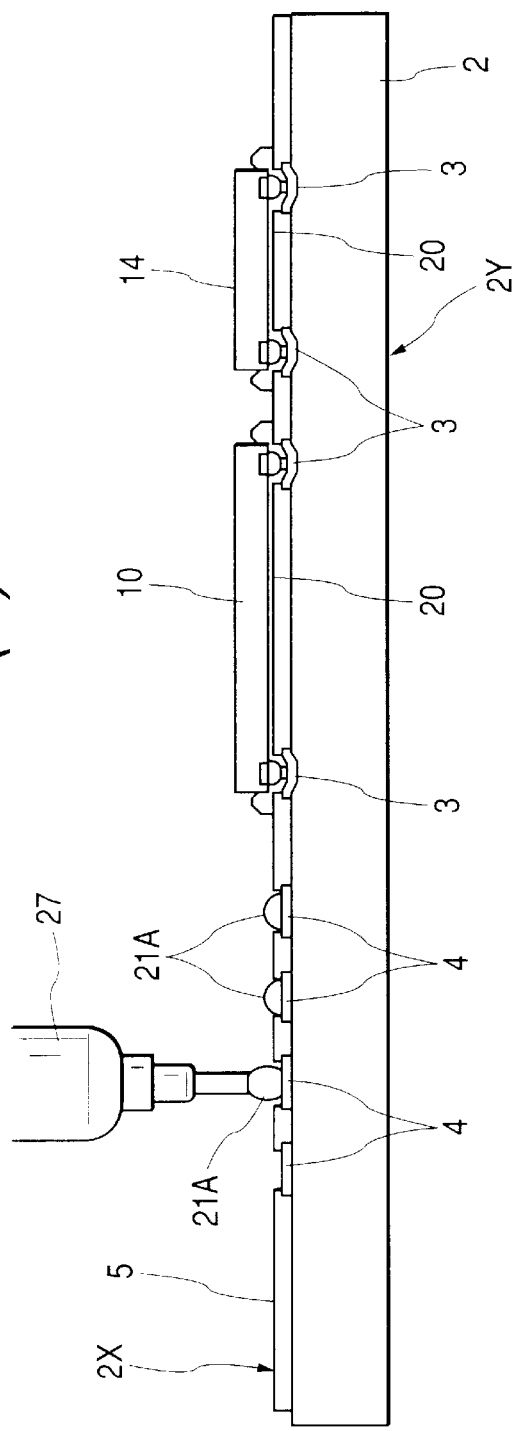
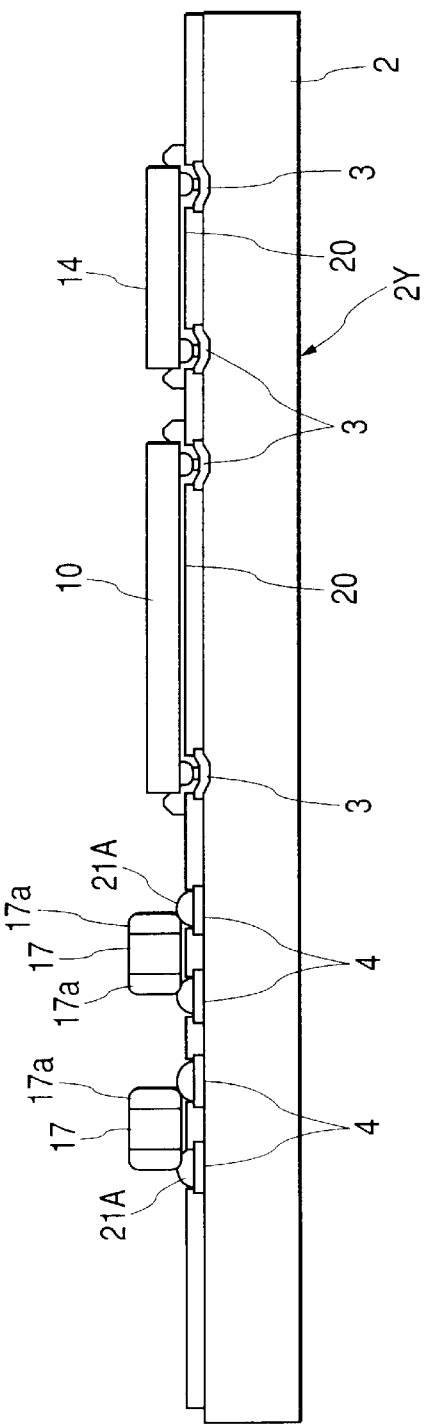

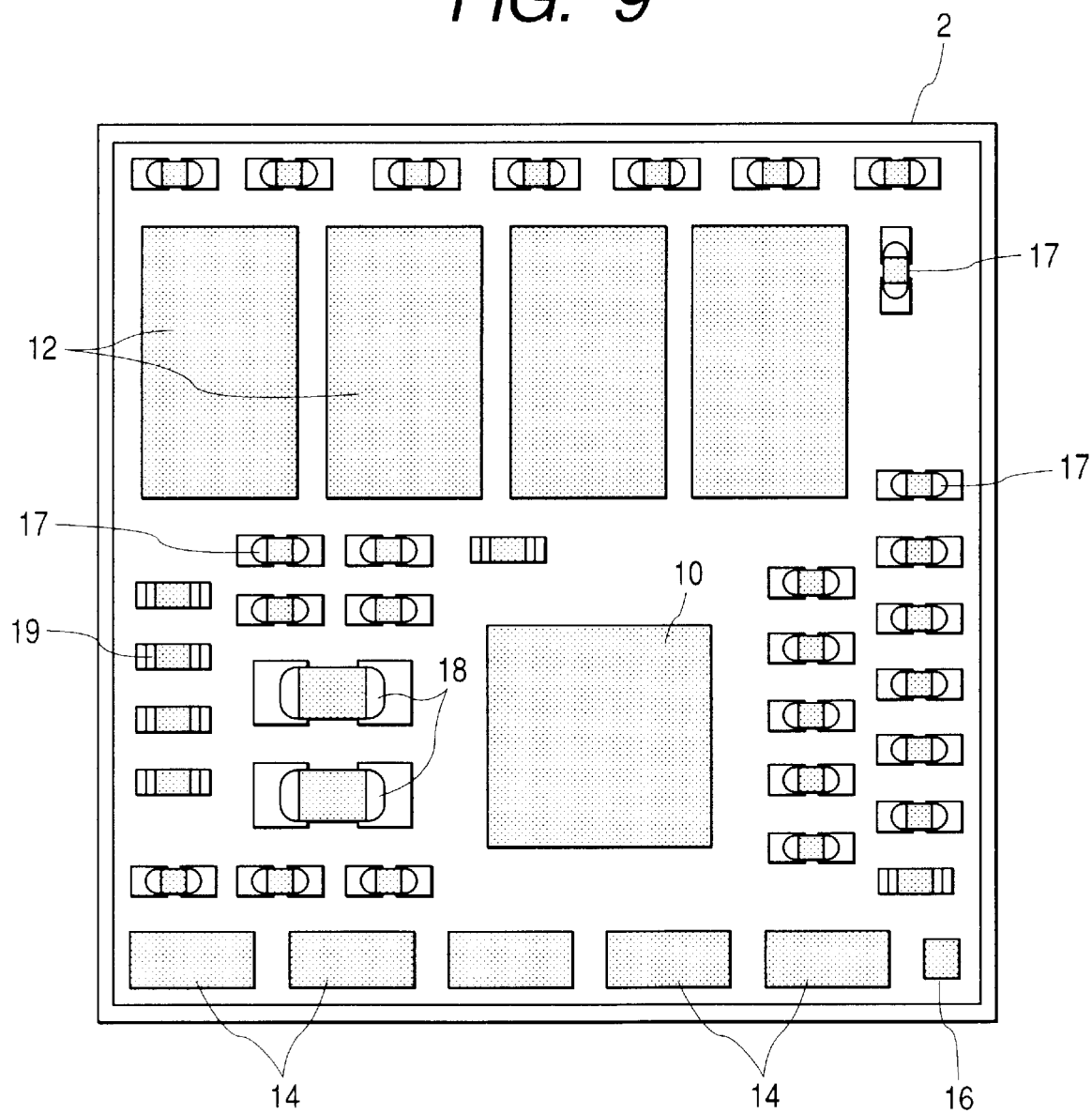

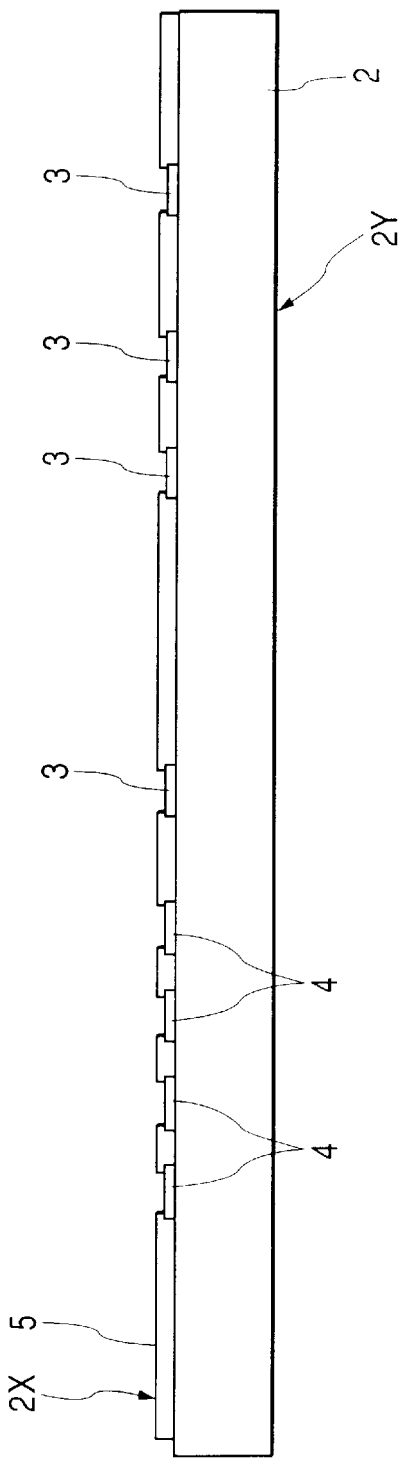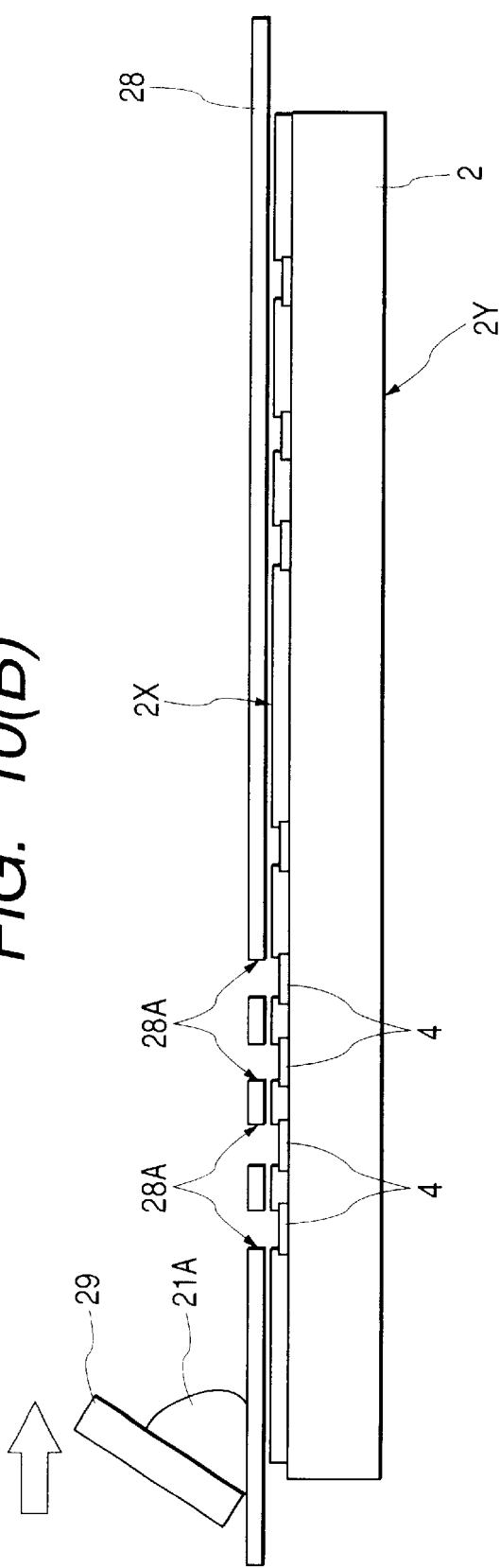

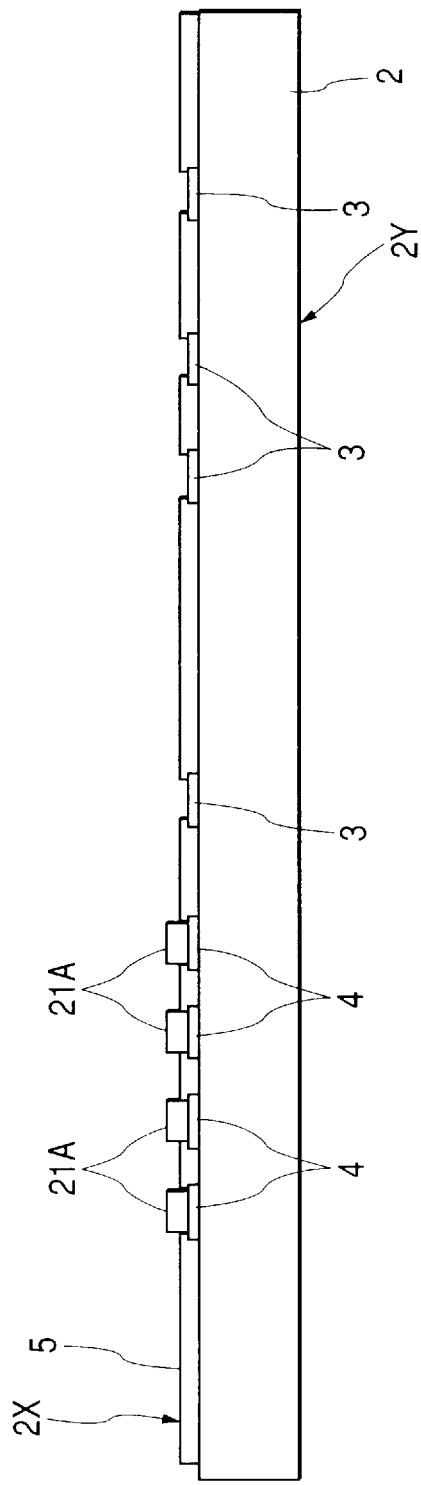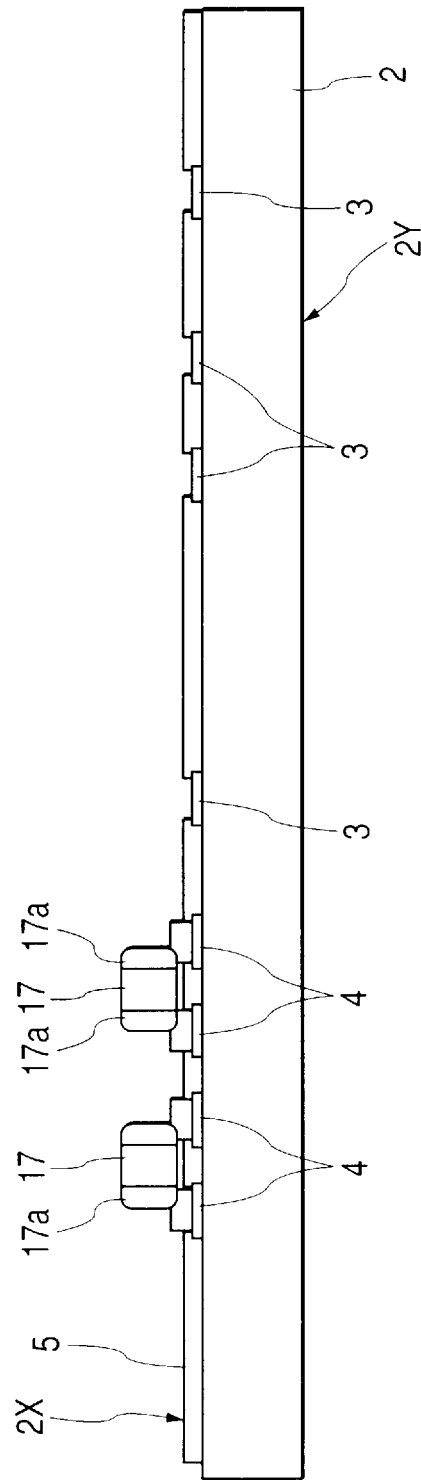

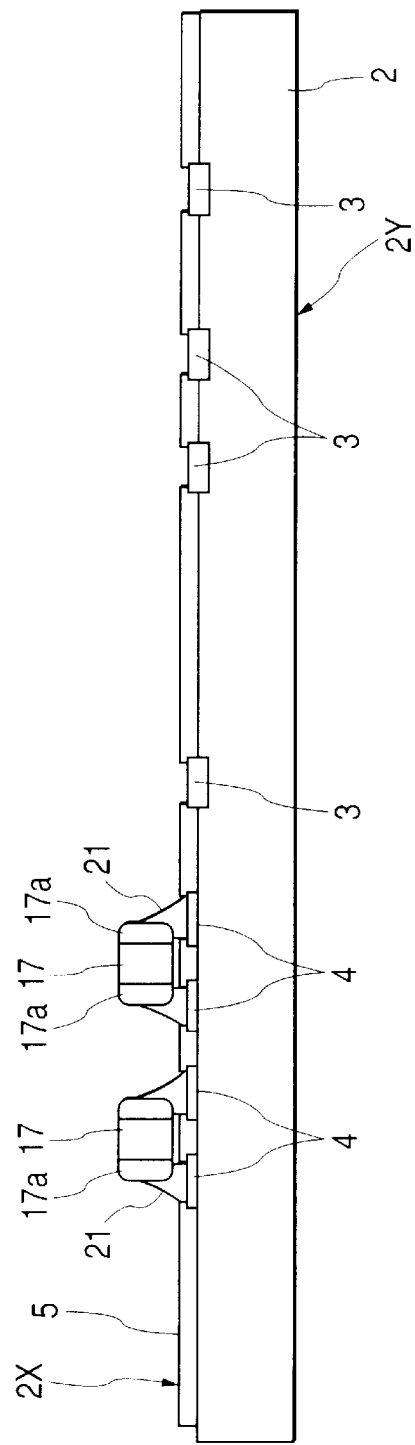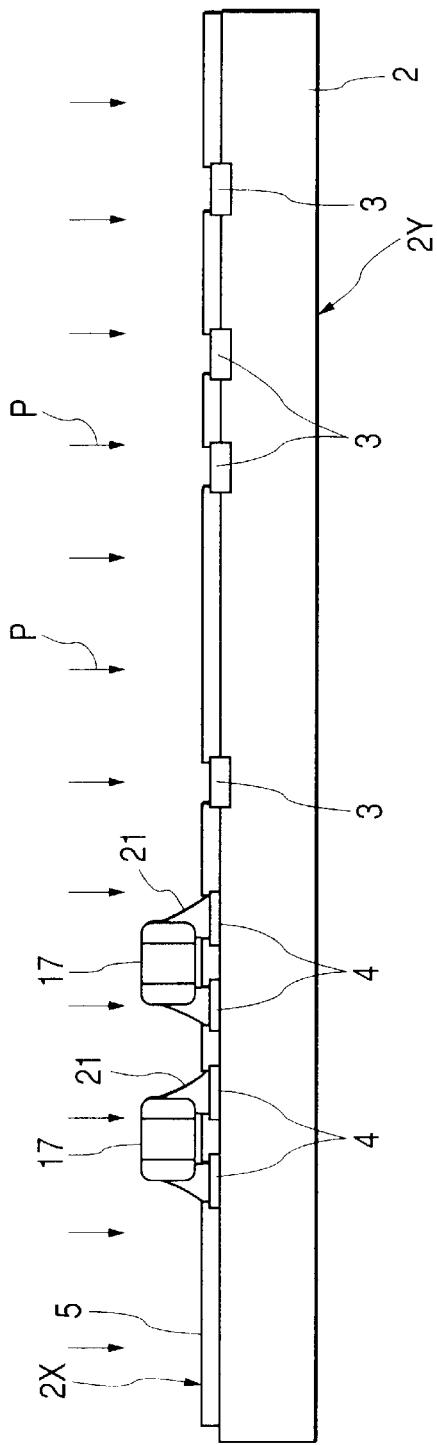

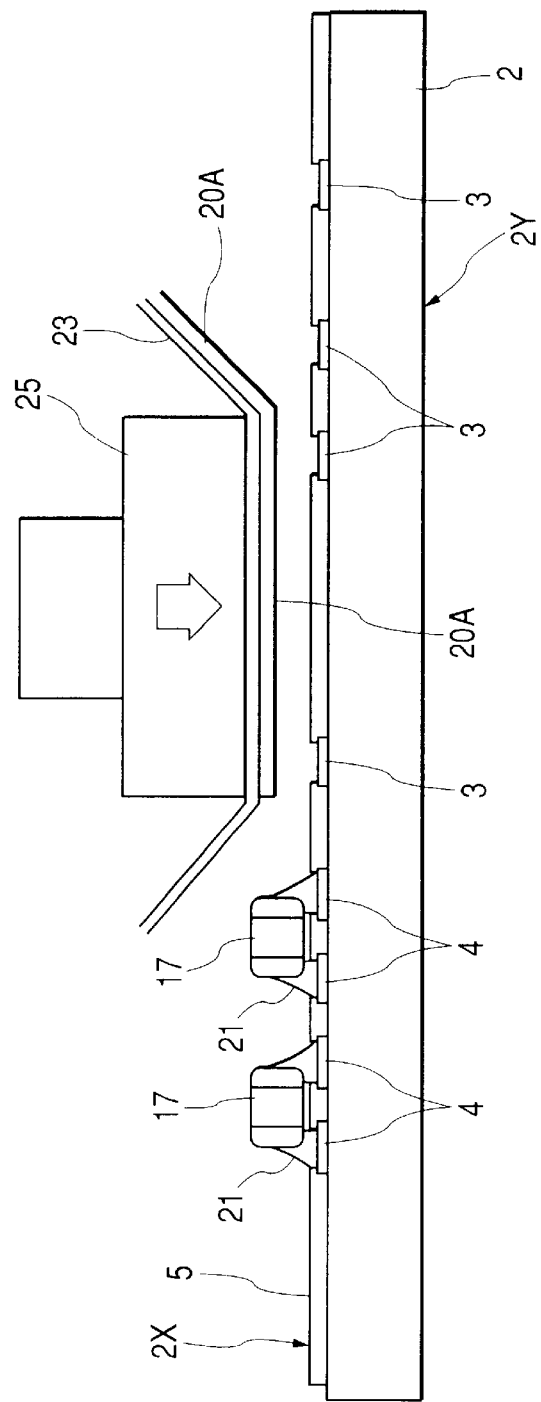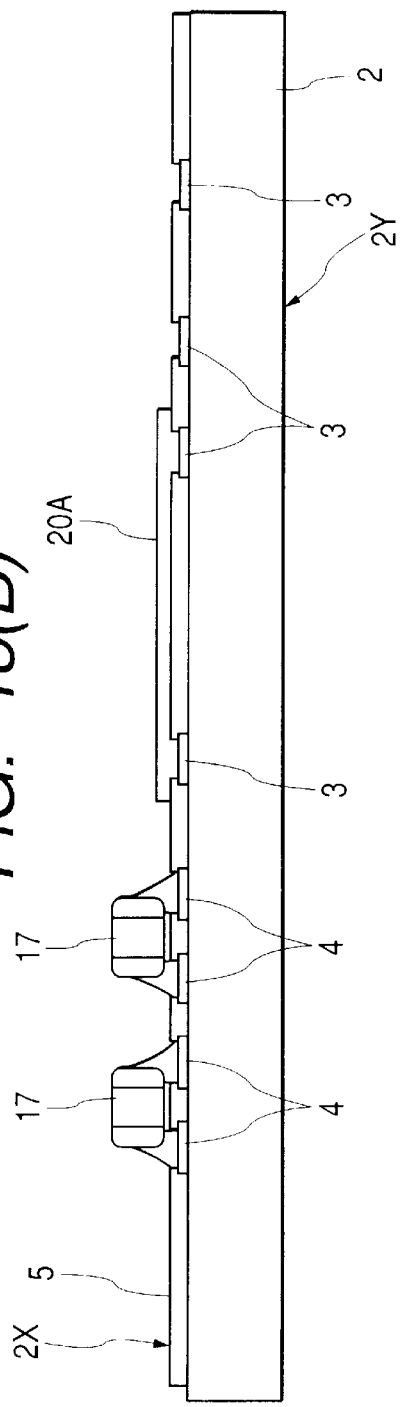

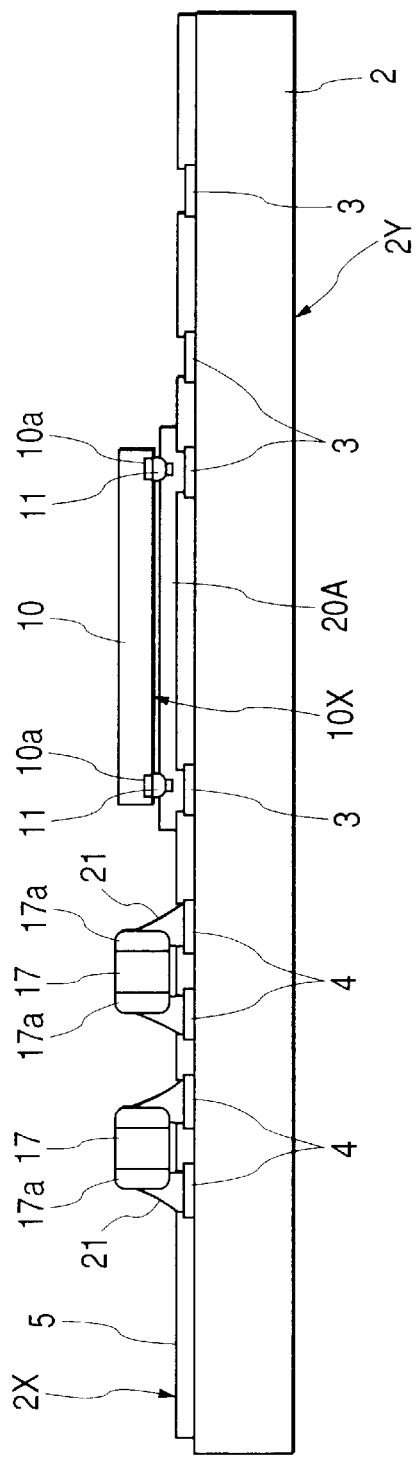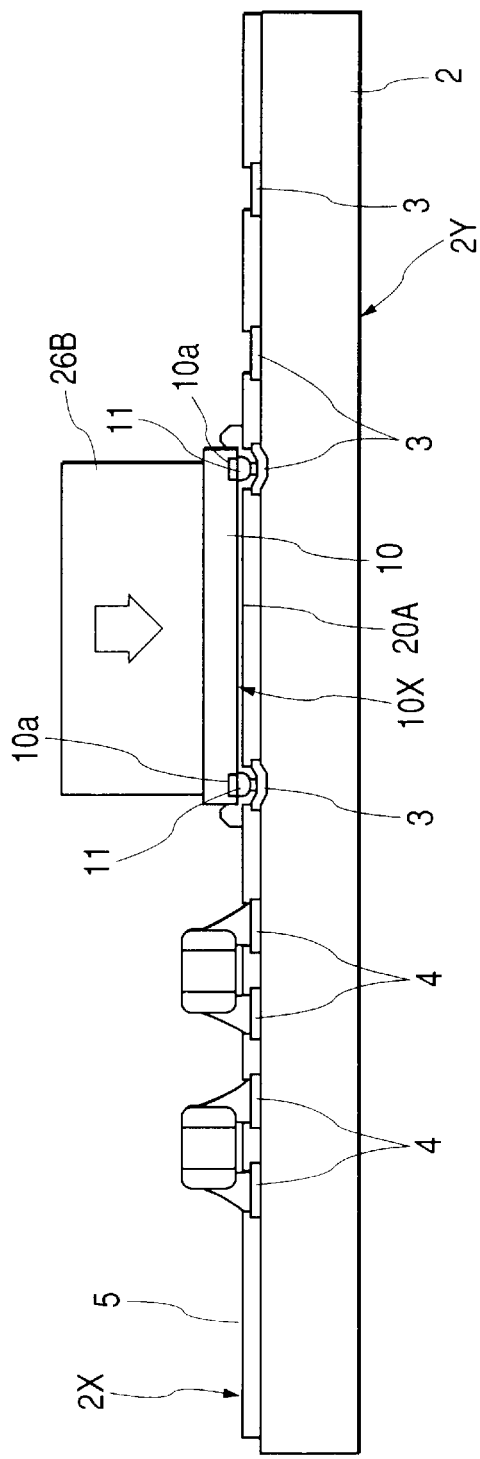

ELECTRONIC DEVICE AND A METHOD OF MANUFACTURING THE SAME

FIELD OF THE INVENTION

The present invention relates to an electronic device and a manufacturing technology thereof, and particularly to a technology effective for application to an electronic device having electronic components mounted on a wiring board, which is suitable for use in each of different embodiments.

BACKGROUND OF THE INVENTION

There has been known an electronic device called an "MCM (Multi Chip Module)" as an electronic device. The MCM is one wherein a plurality of semiconductor chips each having an integrated circuit built therein are mounted or implemented on a wiring board to configure one integrated function. In order to speed up a data transfer rate of the MCM and downsize it, a flip-chip mounting technology for using semiconductor chips (flip chips) wherein protruded electrodes are respectively formed on electrode pads placed on a circuit forming surface, and mounting the same on a wiring board has actively been adopted for the MCM.

In the flip-chip mounting technology, various mounting or packaging methods or systems have been proposed and put into practical use. As one of them, there is known an ACF mounting or packaging system using a sheet-like anisotropic conductive film (ACF: Anisotropic Conductive Film) as an adhesive resin. The ACF mounting system is a method for using a semiconductor chip wherein stud bumps each comprising, for example, gold (Au) are respectively formed on electrode pads placed on a circuit forming surface as protruded electrodes, thermo-compression bonding the semiconductor chip in a state in which an ACF resin is being interposed between the semiconductor chip and a wiring board to thereby bond and fix the semiconductor chip to the wiring board, and electrically connecting connecting portions of wirings of the wiring board and electrode pads of the semiconductor chip respectively. The anisotropic conductive film is one obtained by mixing lots of conductive particles into an insulating-film resin in dispersed form. The ACF mounting has been described in Unexamined Patent Publication Hei No. 10(1998)-270496 (U.S. Pat. No. 6,208,525).

In addition to the ACF mounting system, there are known an NCF mounting system using a sheet-like non conductive film (NCF: Non Conductive Film) as an adhesive resin, an ACP mounting system using a paste-like anisotropic conductive resin (ACP: Anisotropic Conductive Paste) as an adhesive resin, etc.

On the other hand, soldering devices or electronic components mounted or packaged by soldering are known as surface mount devices (SMD: Surface Mount Devices) mounted on a wiring board in addition to the semiconductor chip. The soldering electronic components include passive components or parts and active components or parts. As the soldering passive components, may be mentioned, for example, chip capacitors, chip resistors, chip inductors, etc. As the soldering active components, may be mentioned, for example, semiconductor devices such as a BGA (Ball Grid Array) type, a CSP (Chip Size Package) type, a QFP (Quad Flatpack Package) type, a QFN (Quad Flatpack Non-Leaded Package) type, which respectively include packaged semiconductor chips, etc.

SUMMARY OF THE INVENTION

Meanwhile, the present inventors have developed an MCM wherein a semiconductor chip (hereinafter called a "compression mounted IC (Integrated Circuit) chip") mounted by thermo-compression bonding as in the ACG mounting system, and soldering electronic components are placed on the same wiring board in mixed form. Upon the development of the present MCM, the present inventors have found out the following problems.

(1) The soldering electronic components include those whose post-mount heights (each corresponding to a height from one main surface of a wiring board to the top portion) are higher than that of the compression mounted IC chip. When such soldering electronic components high in height are mounted prior to the compression mounted IC chip, a thermo-compression bonding tool (thermo-compression bonding head) for thermo-compression bonding the compression mounted IC chip become easy to contact the already-mounted soldering electronic components upon mounting the compression mounted IC chip. It is therefore necessary to widen the interval between each soldering electronic component and its corresponding compression mounted IC chip. Further, this would lead to the inhibition of a size reduction in MCM.

When it is desired to collectively thermo-compression bond a plurality of compression mounted IC chips with a view toward improving productivity, it is necessary to use one larger than the compression mounted IC chip as a thermo-compression bonding tool. However, when soldering electronic components high in height exist within a range for the thermo-compression bonding tool, it becomes difficult to collectively thermo-compression bond the IC chips.

(2) A soldering paste material (corresponding to a semi-solid soldering material obtained by mixing and kneading lots of solder particles and flux together) is supplied to connecting portions of wirings for the wiring board, soldering electronic components are thereafter mounted so that the connecting portions of the wirings for the wiring board and their corresponding electrode portions of the soldering electronic components are held face to face with one another with the soldering paste material interposed therebetween, and subsequently they are subjected to heat treatment to thereby melt the soldering paste material, whereby the mounting of the soldering electronic components is carried out. For the purpose of the supply of the soldering paste material, a screen printing method or a dispense method is used. The screen printing method is a method for transferring a soldering paste material placed on a screen mask to the surface of a substrate through each aperture or opening defined in the screen mask by means of a squeegee. The dispense method is a method for discharging a soldering paste material through a thin nozzle and applying it.

The screen printing method capable of collectively supplying the soldering paste material is suitable for the achievement of an improvement in productivity of the MCM. However, when the compression mounted IC chip is mounted prior to each soldering electronic component, it is difficult to supply the soldering paste material by means of the screen printing method upon the mounting of the soldering electronic components. The supply of the soldering paste material is carried out through the use of a screen mask called an "embossed mask" provided with at least one protruded portion at a portion of the already-mounted compression mounted IC chip so as to avoid the portion, whereby the supply of the soldering paste material by one operation is allowed. In such a case, however, it is necessary to set a plane size of the protruded portion of the embossed mask larger than that of the compression mounted IC chip to thereby produce a smooth protruded shape so that the squeegee can be slid smoothly. Therefore, the soldering electronic components cannot be placed in the neighborhood of the compression mounted IC chip, thereby leading to the inhibition of a size reduction in MCM.

(3) A radiator is selected for the MCM which needs to have high dissipation. Since the back of the compression mounted IC chip, which is opposite to its circuit forming surface, is kept bare, the radiator is mounted onto the back of the compression mounted IC chip with a thermal conductive sheet interposed therebetween, the compression mounted IC chip can obtain a high radiating effect. However, when the soldering electronic components higher than the compression mounted IC chip in post-mount height exist, the soldering electronic components interfere with the contact between the back of the compression mounted IC chip and the thermal conductive sheet, whereby the dissipation of the MCM is reduced.

An object of the present invention is to provide a technology capable of achieving an improvement in productivity of an electronic device.

Another object of the present invention is to provide a technology capable of achieving a size reduction in electronic device.

A further object of the present invention is to provide a technology capable of achieving an improvement in dissipation of an electronic device.

The above, other objects, and novel features of the present invention will become apparent from the description of the present specification and the accompanying drawings.

Summaries of typical ones of the inventions disclosed in the present application will be described in brief as follows:

(1) There is provided a method of manufacturing an electronic device including a first electronic component mounted on one main surface of a wiring board by being thermo-compression bonded by means of a thermo-compression bonding tool with an adhesive resin interposed between a first area of the one main surface of the wiring board and the first electronic component, and a second electronic component mounted on a second area different from the first area of the one main surface of the wiring board by melting a soldering paste material and higher than the first electronic component in post-mounting height, and wherein the first electronic component is mounted before the mounting of the second electronic component.

(2) In the method described in the above means (1), the adhesive resin is a thermosetting resin.

(3) In the method described in the above means (1), the temperature of the thermo-compression bonding tool at the time that the first electronic component is thermo-compression bonded, is higher than a melting point of the soldering paste material.

(4) In the method described in the above means (1), the first electronic component is an active part with circuits built therein, and the second electronic component is a passive part.

(5) There is provided a method of manufacturing an electronic device including a first electronic component mounted on one main surface of a wiring board by being thermo-compression bonded by means of a thermo-compression bonding tool with an adhesive resin interposed between a first area of the one main surface of the wiring board and the first electronic component, and a second electronic component mounted on a second area different from the first area of the one main surface of the wiring board by melting a soldering paste material, and wherein the second electronic component is mounted before the mounting of the first electronic component.

(6) In the method described in the above means (5), the supply of the soldering paste material is carried out by a screen printing method.

(7) In the method described in the above means (5), the second electronic component is higher than the first electronic component in post-mounting height.

(8) In the method described in the above means (5), the first electronic component is a passive part with circuits built therein, and the second electronic component is an active part.

(9) There is provided an electronic device comprising:
a wiring board;
a plurality of first electronic components implemented in a first area of one main surface of the wiring board;
a plurality of second electronic components implemented in a second area different from the first area of the one main surface of the wiring board, and each having a height extending from the one main surface of the wiring board to the top portion, which is higher than that of each first electronic component; and
a thermal conductive sheet mounted to the plurality of first electronic components and dismounted to the plurality of second electronic components.

(10) In the electronic device described in the above means (9), a radiator mounted to the thermal conductive sheet and formed in a flat size for covering the plurality of first electronic components and the plurality of second electronic components is provided.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 4(A) and FIG. 4(B) are cross-sectional views for describing the manufacture of the MCM showing the first embodiment of the present invention;

FIG. 5(A) and FIG. 5(B) are cross-sectional views for describing the manufacture of the MCM illustrating the first embodiment of the present invention;

FIG. 7(A) and FIG. 7(B) are cross-sectional views for describing the manufacture of the MCM illustrating the first embodiment of the present invention;

FIG. 9 is a plan view for describing the manufacture of the MCM illustrating the first embodiment of the present invention;

FIG. 10(A) and FIG. 10(B) are cross-sectional views for describing the manufacture of an MCM showing a second embodiment of the present invention;

FIG. 11(A) and FIG. 11(B) are cross-sectional views for describing the manufacture of the MCM illustrating the second embodiment of the present invention;

FIG. 12(A) and FIG. 12(B) are cross-sectional views for describing the manufacture of the MCM depicting the second embodiment of the present invention;

FIG. 13(A) and FIG. 13(B) are cross-sectional views for describing the manufacture of the MCM showing the second embodiment of the present invention;

FIG. 14(A) and FIG. 14(B) are cross-sectional views for describing the manufacture of the MCM illustrating the second embodiment of the present invention;

DESCRIPTION OF THE PREFERRED EMBODIMENTS

Figure 1:
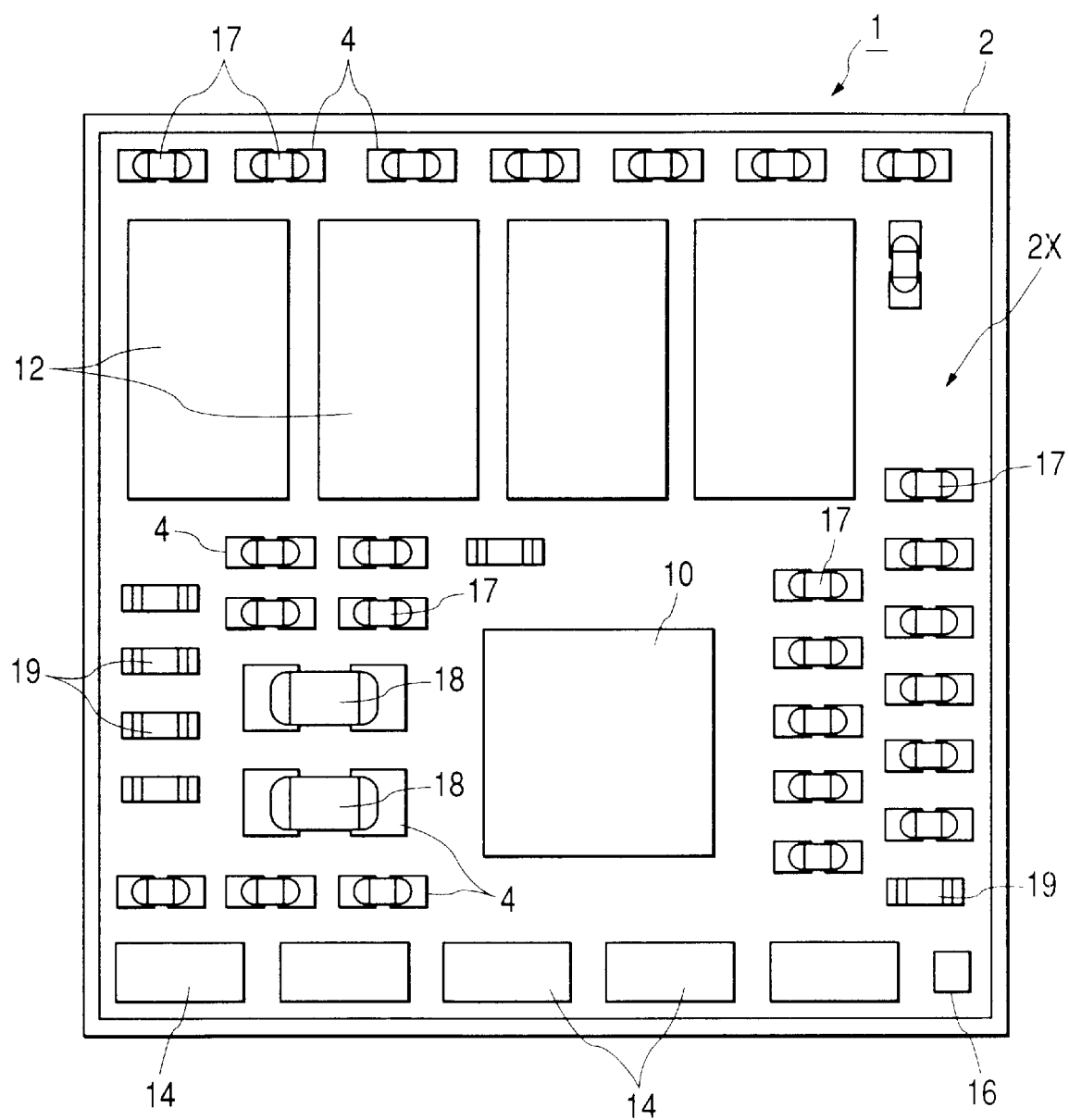
FIG. 1 is a typical plan view of an MCM (electronic device) showing a first embodiment of the present invention.

Preferred embodiments of this invention will hereinafter be described in detail with reference to the accompanying drawings.

Incidentally, ones each having the same function in all drawings for describing the embodiments of the invention are respectively identified by the same reference numerals and their repetitive description will therefore be omitted.

Figure 2:
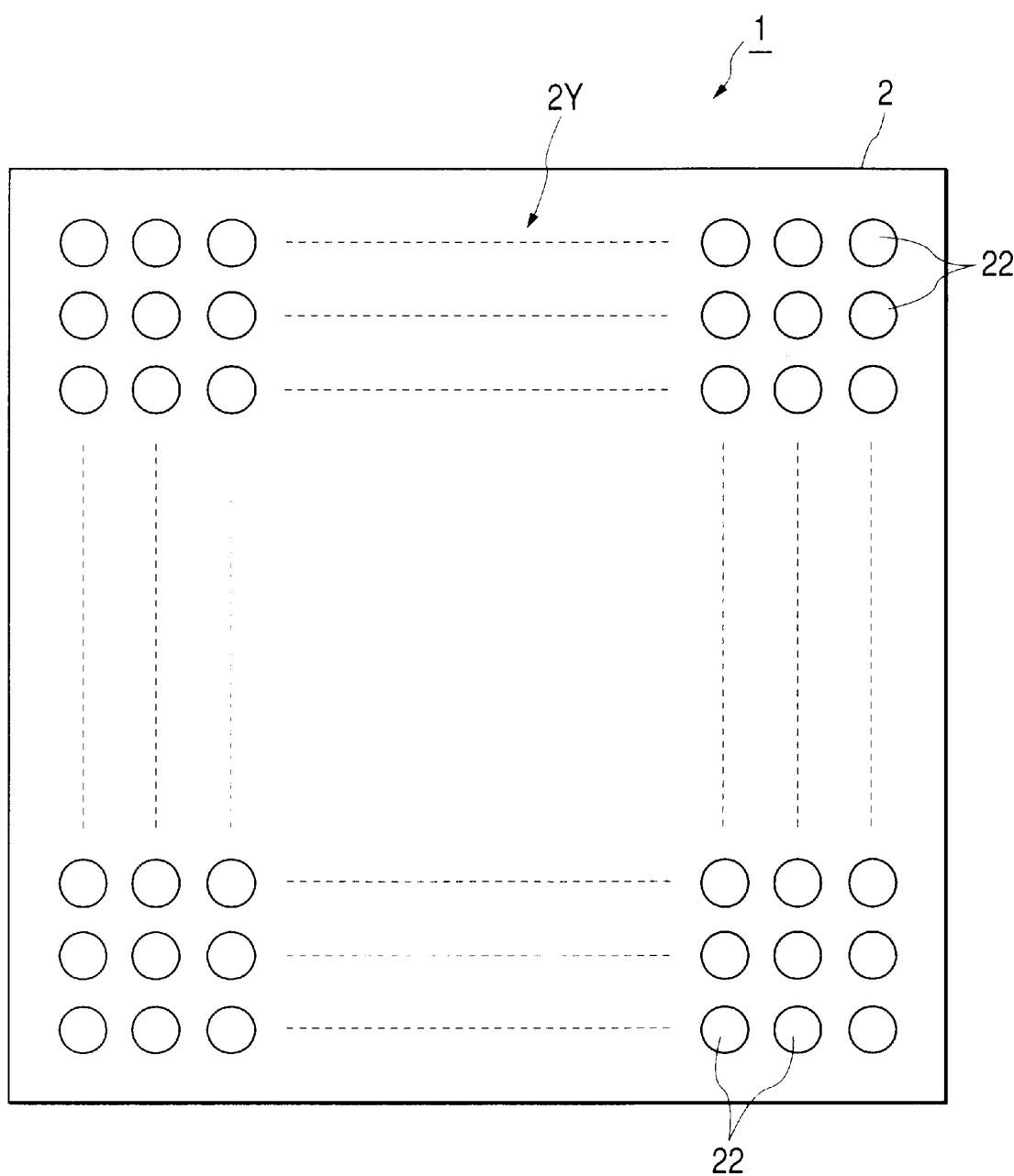
FIG. 2 is a typical bottom view of the MCM shown in FIG. 1.
Figure 3:
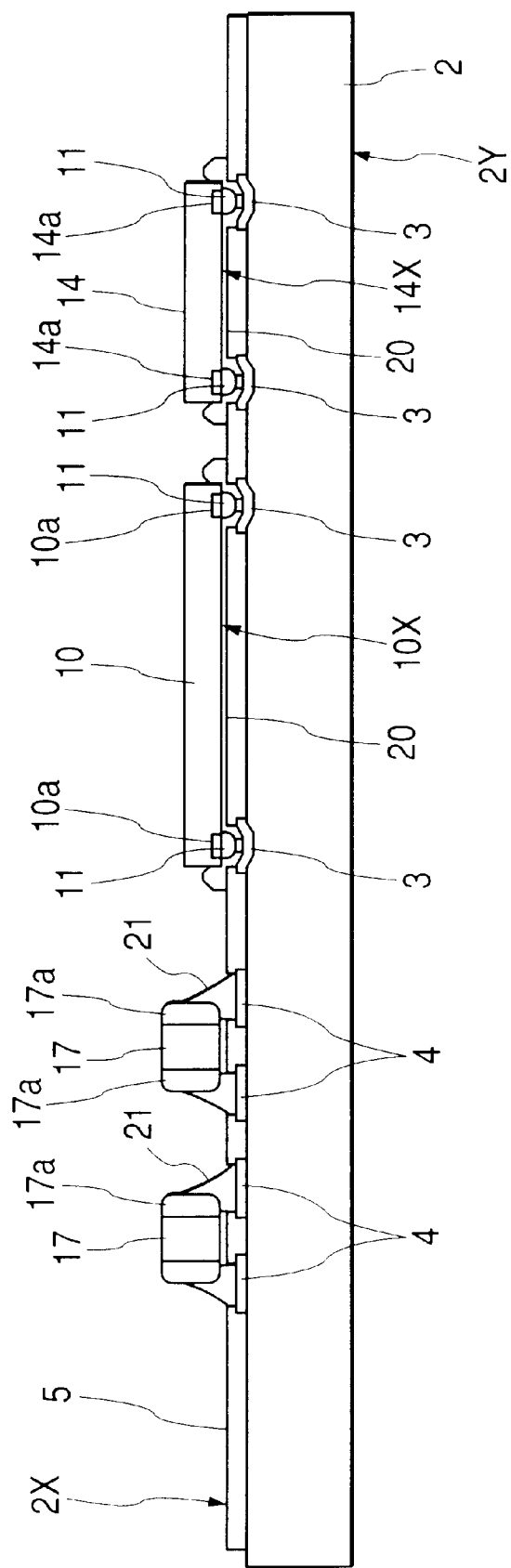
FIG. 3 is a cross-sectional view illustrating the state of mounting of a control chip, buffer chips and chip capacitors built in the MCM shown in FIG. 1.

FIG. 1 is a typical plan view of an MCM (electronic device) showing a first embodiment of the present invention. FIG. 2 is a typical bottom view of the MCM shown in FIG. 1. FIG. 3 is a typical cross-sectional view showing the state of mounting or implementation of chip capacitors, a control chip, and buffer chips built in the MCM shown in FIG. 1. Incidentally, hatching indicative of a section is omitted in FIG. 3 to make it easy to see the drawings.

As shown in FIGS. 1 and 2, an MCM (electronic device) 1 according to the present embodiment has a configuration wherein a plurality of soldering parts or components and crimped IC chips are placed on one main surface 2X of a wiring board 2, and a plurality of ball-shaped solder bumps 22 are disposed on a reverse side or back (the other main surface) 2Y thereof opposite to the main surface 2X of the wiring board 2 as external connecting terminals. One semiconductor chip (hereinafter called a "control chip") 10 having a control circuit built therein, four semiconductor chips (hereinafter called "memory chips") 12 each having a memory circuit (e.g., SDRAM: Synchronous Dynamic Random Access Memory) built therein, five semiconductor chips (hereinafter called "buffer chips") 14 each having a buffer circuit built therein, and one semiconductor chip (hereinafter called an "operation or arithmetic chip") 16 having an NAND circuit built therein are used as the crimped IC chips. These compression mounted electronic parts or components are mounted or packaged by an ACF packaging system. A plurality of chip capacitors (17, 18) and chip resistors 19 are used as soldering electronic parts or components. These soldering electronic components are mounted by a soldering reflow method.

The solder bumps 22 are respectively formed of a solder material having a Pb-Sn composition, for example. The solder bumps 22 are electrically and mechanically connected to their corresponding electrode pads placed on the back 2Y of the wiring board 2.

The planar shapes of the control chip 10, memory chips 12, buffer chips 14 and an operation chip 16 are respectively formed in a square fashion. In the present embodiment, the buffer chips 14 and the memory chips 12 are respectively shaped in the form of a rectangle, for example, whereas the control chip 10 and the operation chip 16 are respectively shaped in the form of a square, for example.

Although not limited to the control chip 10, memory chips 12, buffer chips 14 and operation chip 16, they are respectively configured so as to principally have a semiconductor substrate, a multilayer interconnection layer formed by laminating an insulating layer and a wiring layer on a circuit forming surface of the semiconductor substrate in plural stages, and a surface protective film (final protection) formed so as to cover the multilayer interconnection layer. The semiconductor substrate is formed of a monocrystal silicon, for example, the insulating layer is formed of a silicon oxide film, for example, and the wiring layer is formed of a metal film such as aluminum (Al) or an aluminum alloy or the like. A surface protective film for each memory chip 12 is formed of a polyimide resin capable of achieving an improvement in alpha ray-resistant strength to a memory, for example. A surface protective film for each of the control chip 10, buffer chips 14 and operation chip 16 is formed of an insulating film such as silicon oxide or silicon nitride.

Although not illustrated in detail, the wiring board 2 is configured so as to have a rigid substrate, a flexible layer formed on the rigid substrate by a build-up process, and an insulating film 5 formed on the flexible layer. The rigid substrate and flexible layer are formed as a multilayer interconnection structure. Each of insulating layers for the rigid substrate is formed of, for example, a high elastic resin plate obtained by impregnating a glass fiber with an epoxy or polyimide resin. Each of insulating layers for the flexible layer is formed of an epoxy low elastic resin. Further, respective wiring layers for the rigid substrate and flexible layer are respectively formed of a metal film which comprises copper (Cu), for example. The insulating film 5 is formed of an epoxy resin, for example. The insulating film 5 serves so as to control the spread of on-mounting solder leakage to the soldering electronic components (17, 18 and 19 in the present embodiment) and ensure adhesion power of an adhesive or bonding rein at package with respect to the compression mounted electronic parts or components (10, 12, 14 and 16 in the present embodiment).

A plurality of connecting portions 3 and electrode pads 4 both comprising portions of wirings formed in the wiring layer corresponding to the top layer of the wiring board 2 are provided in the wiring layer. These connecting portions 3 and electrode pads 4 are respectively exposed from the one main surface 2X of the wiring board 2 through apertures or opening defined in the insulating film 5.

In the control chip 10 and each buffer chip 14, as shown in FIG. 3, a plurality of electrode pads (10a and 14a) are formed on their corresponding circuit forming surfaces (10X and 14X) respectively corresponding to one main surfaces of one main surfaces and other main surfaces opposite to one another, of the respective chips. The plurality of electrode pads (10a and 14a) of the respective chips are formed in their corresponding wiring layers corresponding to the top layers of the multilayer interconnection layers for the respective chips. They are exposed from their corresponding circuit forming surfaces of the respective chips through bonding openings or apertures defined in the surface protective films of the respective chips. Although not illustrated in the drawing, a plurality of electrode pads are formed on their corresponding circuit forming surfaces of the memory and operation chips 12 and 16 even in the case of both chips in a manner similar to the control chip 10 and the buffer chips 14. The electrode pads 10a of the control chip 10, the electrode pads 14a of the buffer chip 14 and the electrode pads of the operation chip 16 are disposed in a four-side pad arrangement, and the electrode pads of each memory chip 12 are provided in a center-pad arrangement.

Stud bumps 11 made up of, for example, Au are respectively formed on the electrode pads of the control chip 10 and the buffer chips 14 and the electrode pads of the memory chips 12 and the operation chip 16 as protruded electrodes at the stage preceding a mounting process. The stud bumps 11 are formed by, for example, a ball bonding method of utilizing ultrasonic vibrations in combination with thermo-compression bonding through the use of Au wires, for example. The present ball bonding method is a method of forming balls at leading ends of the Au wires, thereafter thermo-compression bonding the balls to their corresponding electrode pads of each chip while the ultrasonic vibrations are being applied thereto, and subsequently cutting the Au wires from portions of the balls to thereby form bumps. Thus the stud bumps formed on the electrode pads are firmly connected to their corresponding electrode pads.

As shown in FIG. 3, the control chip 10 is mounted in a state in which its circuit forming surface 10X is placed face-to-face with one main surface 2X of the wiring board 2. For instance, an anisotropic conductive resin 20 is interposed between each buffer chip 14 and the wiring board 2 as a bonding or adhesive resin. The control chip 10 is bonded and fixed to the wiring board 2 by means of the anisotropic conductive resin 20.

The stud bumps 11 of the control chip 10 are respectively placed between the electrode pads 10a of the control chip 10 and the connecting portions 3 placed on the wiring board 2 through the openings defined in the insulating film 5 to thereby electrically connect the two. The stud bumps 11 are pressure-welded to their corresponding connecting portions 5a of the wiring board 2 by a heat shrinkage force (corresponding to a contractile or shrinkage force produced when the anisotropic conductive resin 20 is restored from a heated state to a room-temperature state) of the anisotropic conductive resin 20 interposed between the wiring board 2 and the control chip 10, and a thermosetting shrinkage force (corresponding to a contractile or shrinkage force produced when a thermosetting resin is cured), a crimping force developed by a thermo-compression bonding tool, etc. Parts of conductive particles mixed into the anisotropic conductive resin 20 in large quantities are respectively interposed between the stud bumps 11 and the connecting portions 5a of the wiring board 2. Incidentally, the memory chips 12, the buffer chips 14 and the operation chip 16 are also packaged or mounted in a manner similar to the control chip 10.

Each of the chip capacitors 17 is shaped in the form of a rectangle and has electrode portions 17a at their both ends. The chip capacitors 18 and the chip resistors 19 are also configured in a manner similar to the chip capacitors 17. The chip capacitors 17 and 18 and the chip resistors 19 are electrically and mechanically connected to their corresponding electrode pads 4 of the wiring board 2 by solder 21 through the openings defined in the insulating film 5.

Heights (corresponding to heights from one main surface 2X of the wiring board 2 to the top portions of the post-mounting electronic components) of the post-mounting respective electronic components are as follows.

The heights of the control chip 10 and the memory chip 12 are about 0.4 [mm], the heights of the buffer chip 14 and the operation chip 16 are about 0.28 [mm], the height of each chip capacitor 17 is about 0.85 [mm], the height of each chip capacitor 18 is about 0.8 [mm], and the height of each chip resistor 19 is about 0.45 [mm], respectively.

Figure 8:
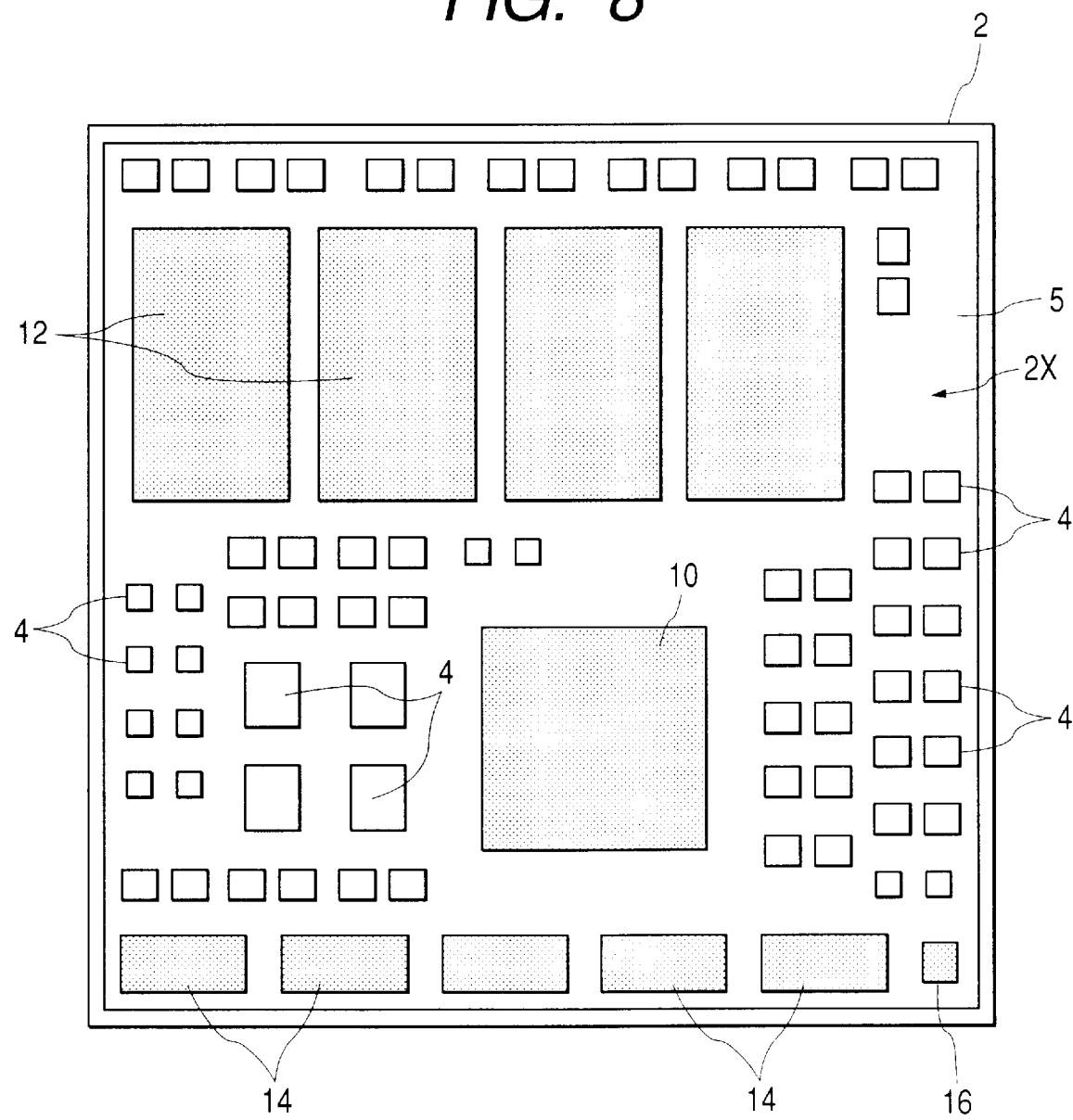
FIG. 8 is a plan view for describing the manufacture of the MCM showing the first embodiment of the present invention.

The manufacture of the MCM 1 will next be explained with reference to FIGS. 4 through 9. FIGS. 4 through 7 are respectively typical cross-sectional views for describing a process for the MCM, and FIGS. 8 and 9 are respectively typical plan views for describing the process for the MCM. Incidentally, hatching indicative of sections are omitted in FIGS. 4 through 7 to make it easy to see the drawings.

As the present embodiment, a description will be made of an embodiment in which soldering electronic components are mounted after the mounting or packaging of compression mounted electronic components.

The compression mounted electronic components (corresponding to the control chip 10, memory chips 12, buffer chips 14 and operation or arithmetic chip 16) and the soldering electronic components (corresponding to the chip capacitors 17 and 18 and chip resistors 19) are first prepared, and a wiring board 2 shown in FIG. 4(A) is prepared. Stud pads 11 have been formed on their corresponding electrode pads of the control chip 10, memory chips 12, buffer chips 14 and operation chip 16.

Next, as shown in FIG. 4(B), a sheet-shaped anisotropic conductive resin film 20A is transferred from a cover tape 23 to its corresponding control chip mounting or loading area of one main surface of the wiring board 2 by means of an applying or sticking tool (sticking head) 25. As shown in FIG. 5(A), the anisotropic conductive resin film 20A is placed on its corresponding control chip mounting area of one main surface 2X of the wiring board 2. As the anisotropic conductive resin film 20A, one is used which is obtained by mixing lots of conductive particles into an epoxy thermosetting resin, for example.

Next, as shown in FIG. 5(B), the corresponding control chip 10 is placed on its corresponding control chip mounting area of one main surface 2X of the wiring board 2 with the anisotropic conductive resin film 20A interposed therebetween. The control chip 10 is placed in such a manner that its circuit forming surface 10X is provided face to face with one main surface 2X of the wiring board 2. The control chip 10 is conveyed from a storage tray to the control chip mounting area of one main surface 2X of the wiring board 2 by means of a conveying collet of a chip loader.

Figure 6A:
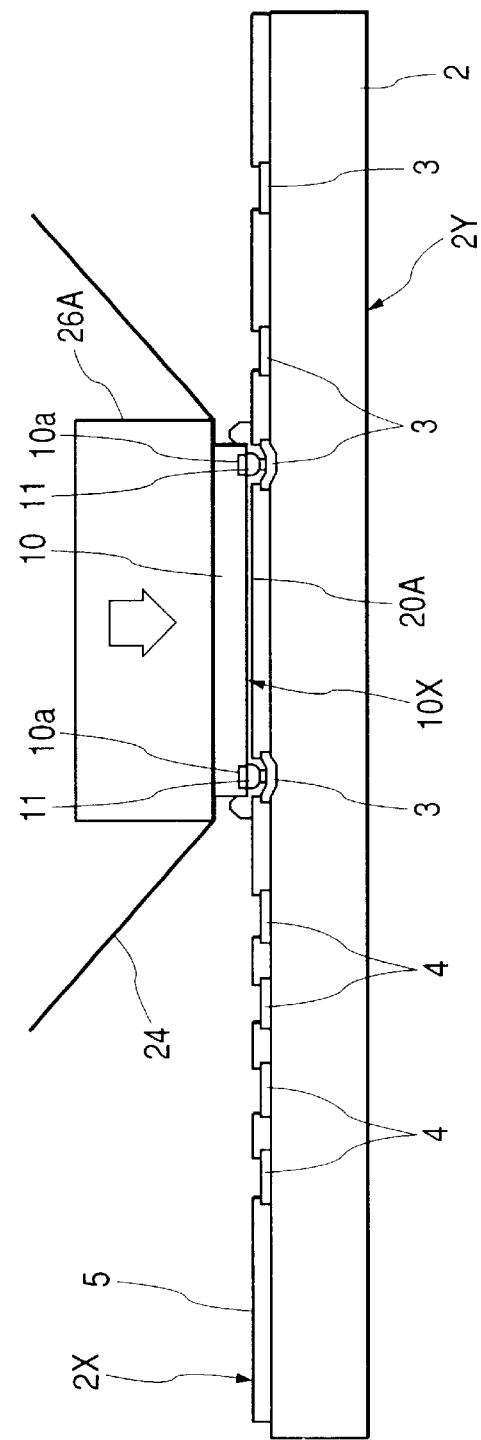
FIG. 6(A) and FIG. 6(B) are cross-sectional views for describing the manufacture of the MCM depicting the first embodiment of the present invention.
Figure 6B:
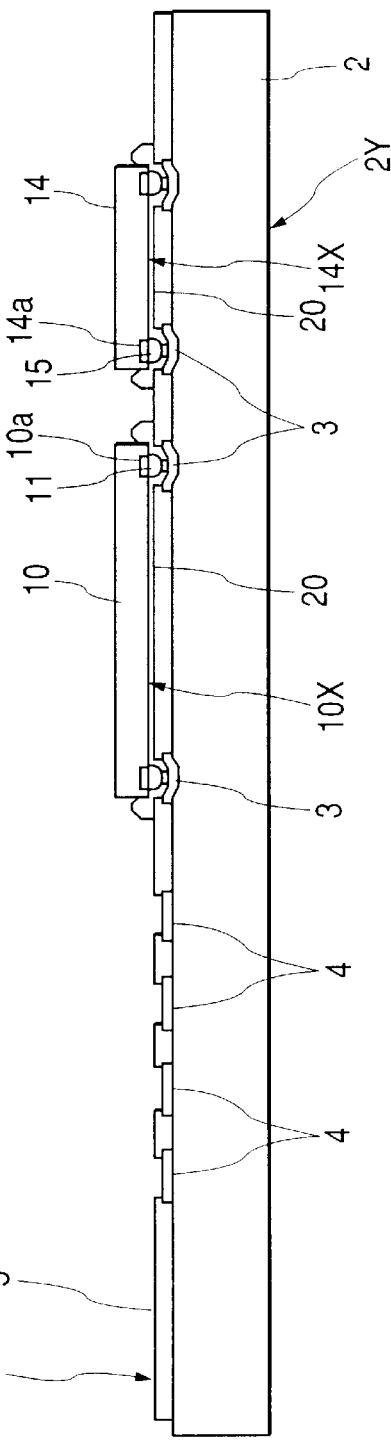

Next, as shown in FIG. 6(A), the control chip 10 is thermo-compression bonded by a thermo-compression bonding tool 26A to connect the stud bumps 11 to their corresponding connecting portions 3 of the wiring board 2. Thereafter, its thermo-compression bonded state is held until the anisotropic conductive resin film 20A is cured. An anisotropic conductive resin film 20A is melted once and thereafter cured. Thus, as shown in FIG. 6(B), the control chip 10 is bonded and fixed to the wiring board 2 by the cured anisotropic conductive resin 20. Electrode pads 10a of the control chip 10 are pressure-welded to their corresponding connecting portions 3 of the wiring board 2 and thereby electrically connected to the connecting portions 3 of the wiring board 2 through the stud bumps 11 and parts of the conductive particles mixed into the anisotropic conductive resin 20 in large quantities. In the present process, the thermo-compression bonding of the chip is carried out with a Teflon sheet 24 interposed between the control chip 10 and the thermo-compression bonding tool 26A.

Next, each of the memory chips 12 is implemented on its corresponding memory chip mounting area of one main surface 2X of the wiring board 2 by a method similar to the control chip 10. Thereafter, each of the buffer chips 14 is mounted on its corresponding buffer chip mounting area of one main surface 2X of the wiring board 2 by the method similar to the control chip 10. Subsequently to it, the operation chip 16 is implemented on its corresponding operation chip mounting area of one main surface 2X of the wiring board 2 by the method similar to the control chip 10. Thus, as shown in FIG. 8, compression mounted or packaged components are placed on one main surface 2X of the wiring board 2.

When the soldering electronic components high in post-package height as compared with the compression mounted electronic components are mounted prior to the mounting of the compression mounted electronic components, the thermo-compression bonding tool 26A for thermo-compression bonding the compression mounted electronic components become easy to contact the already-mounted soldering components. It is therefore necessary to widen the interval between each soldering electronic component and its corresponding compression mounted electronic component. However, the mounting of the compression mounted electronic components prior to the soldering electronic components as in the present embodiment makes it possible to substantially eliminate the problem that the thermo-compression bonding tool 26A makes contact with the soldering components. It is therefore possible to narrow the interval between the soldering electronic component and its corresponding compression mounted electronic component.

In the present embodiment as well, the curing of the anisotropic conductive resin film 20A is carried out under the condition of 180° C. and 20 seconds. Heating at this time is carried out by the thermo-compression bonding tool 26A heated to 235° C. after the temperature of the wiring board 2 has been set to 65° C. in advance. When the curing of the anisotropic conductive resin film 20A is carried out under the condition of 200° C. and 10 seconds to achieve a further improvement in productivity as compared with the condition for the thermo-compression bonding process, it is necessary to increase the set temperature of the thermo-compression bonding tool 26A to 265° C. while the temperature of the wring board 2 is being kept at 65° C. as it is.

When the processing temperature for the thermo-compression bonding process is higher than a melting point (183° C., for example) of solder adopted as a soldering paste material 21A, solder for each soldering component might be melted by heat in the thermo-compression bonding process if the soldering electronic components are mounted prior to the compression mounted electronic components. There is a possibility that when a thermo-compression bonding tool 26A having such a size as to cover the area for mounting the soldering electronic components is adopted in particular, solder will melt even where the post-mounting height of each soldering electronic component is higher or lower than that the post-mounting height of each compression mounted electronic component, thereby causing problems such as the omission of each soldering electronic component, etc. However, when the compression mounted electronic components are mounted prior to the soldering electronic components as described in the present embodiment, heat treatment in the thermo-compression bonding process is in no danger of exerting a bad influence on the soldering electronic components. Further, the heat in the process of melting the soldering paste material 21A is at low risk of exerting a bad influence on the anisotropic conductive resin 20 whose curing has been finished. Thus, an advantageous effect is brought about in that owing to the mounting of the compression mounted electronic components prior to the soldering electronic components, a large thermo-compression bonding tool 26A capable of being adopted even for a process for thermo-compression bonding a large chip and a process for collectively thermo-compression bonding a plurality of chips can commonly be adopted even for a process for thermo-compression bonding a small chip.

When it is desired to collectively thermo-compression bond a plurality of compression mounted electronic components to achieve an improvement in productivity, it is necessary to use a thermo-compression bonding head larger than the compression mounted electronic components. If soldering electronic components high in height exist within a range for a bonding tool in such a case, it is difficult to collectively thermo-compression bond them. However, the mounting of the compression mounted electronic components prior to the soldering electronic components allows the collective thermo-compression bonding of the plurality of compression mounted electronic components.

When the thermo-compression bonding tool 26A larger than at least the compression mounted electronic components is adopted as described in the present embodiment, a Teflon sheet 24 can be interposed between each of the compression mounted electronic components and the thermo-compression bonding tool 26A to prevent the thermo-compression bonding tool 26A from being contaminated due to the anisotropic conductive resin 20 that extends out toward the periphery of each compression mounted electronic component.

Next, a soldering paste material 21A is supplied onto each electrode pad 4 in one main surface 2X of the wiring board 2. The supply of the soldering paste material 21A is carried out by a dispenser method for discharging the soldering paste material 21A from a thin nozzle 27 and applying it to each electrode pad as shown in FIG. 7(A). As the soldering paste material 21A, a soldering paste material is used which is obtained by blending and kneading at least fine solder particles and flux. In the present embodiment, a soldering paste material obtained by mixing and kneading solder particles each having a 37 [wt %]Pb-63[wt %]Sn composition, for example is used. Incidentally, the flux may include a pine resin, an active material and an organic solvent or the like.

Next, as shown in FIG. 7(B), chip capacitors 17 and 18 and chip resistors 19 are placed on their corresponding electrode pads 4 of one main surface 2X of the wiring board 2 with the soldering paste material 21A interposed therebetween. Afterwards, heat treatment is done to melt the soldering paste material 21A, whereby as shown in FIG. 3, the electrode pads 4 on the wiring board 2 and the electrodes 17A of the chip capacitors 17 are electrically and mechanically connected to one another by means of solder 21, and the electrode pads 4 on the wiring board 2 and the electrodes for the chip capacitors 18 and the chip resistors 19 are also electrically and mechanically connected to one another by the solder 21 in a manner similar to the chip capacitors 17. Thus, as shown in FIG. 9, the soldering electronic components are placed on one main surface 2X of the wiring board 2.

In the process for melting the soldering paste material 21A, the periphery of each soldering electronic component is contaminated by the composition of the flux contained in the soldering paste material 21A. However, the mounting of the compression mounted electronic components prior to the soldering electronic components makes it possible to prevent the respective connecting portions 3 of the wiring board 2 connected to the compression mounted electrode components from being contaminated by the flux composition.

According to the present embodiment as described above, the following advantageous effects are obtained.

(1) The soldering electronic components high in post-mounting height as compared with the compression mounted electronic components are mounted or packaged prior to the compression mounted electronic components. Thus, since it is possible to substantially eliminate the problem that the thermo-compression bonding tool 26A makes contact with the soldering electronic components, the intervals between the soldering electronic components and the compression mounted electronic components can be narrowed respectively. As a result, the MCM 1 can be reduced in size.

Owing to the implementation or packaging of the compression mounted electronic components prior to the soldering electronic components, the large thermo-compression bonding tool 26A capable of being adopted even for the process for thermo-compression bonding the large chip and the process for collectively thermo-compression bonding the plurality of chips can commonly be adopted even for the process for thermo-compression bonding each small chip.

Since the plurality of compression mounted electronic components can collectively be thermo-compression bonded, an improvement in productivity of the MCM 1 can be achieved.

When the thermo-compression bonding tool 26A larger than at least the compression mounted electronic component is adopted, the Teflon sheet 24 can be interposed between each of the compression mounted electronic components and the thermo-compression bonding tool 26A to prevent the thermo-compression bonding tool 26A from being contaminated by the anisotropic conductive resin 20 that extends out toward the periphery of each compression mounted electronic component. As a result, an improvement in productivity of the MCM 1 can be achieved.

Mounting the compression mounted electronic components prior to the soldering electronic components makes it possible to prevent the respective connecting portions 3 of the wiring board 2 connected to the compression mounted electrode components from being contaminated by the flux composition. As a result, an improvement in productivity of the MCM 1 can be achieved.

(2) The supply of the soldering paste material 21A is carried out by the dispenser method. Thus, since the soldering paste material 21A can be supplied onto the electrode pads 4 of the wiring board 2 even after the mounting of the compression mounted electronic components, the soldering electronic components can be implemented or packaged even after the implementation of the compression mounted electronic components.

The supply of the soldering paste material 21A subsequent to the mounting of the compression mounted electronic components can be carried out even by a screen printing method using an embossed mask. In such a case, however, it is difficult to place each of the soldering electronic components in the neighborhood (about 5 mm or less) of the compression mounted electronic component. Accordingly, the supply of the soldering paste material by the dispenser method is advantageous to achieve a size reduction in MCM 1. On the other hand, when semiconductor devices such as multi-pin BGA, CSP, QFP and QFN types, etc. are installed as soldering electronic components, the number of points to supply the soldering paste material increases. It is therefore disadvantageous to supply the soldering paste material by the dispenser method. When such multi-pin semiconductor devices are packaged or implemented, the supply of the soldering paste material by the screen printing method using the embossed mask is advantageous.

As a second embodiment, a description will be made of an embodiment wherein upon the manufacture of an MCM, compression mounted components are implemented after the mounting of soldering mounted components.

Figure 15:
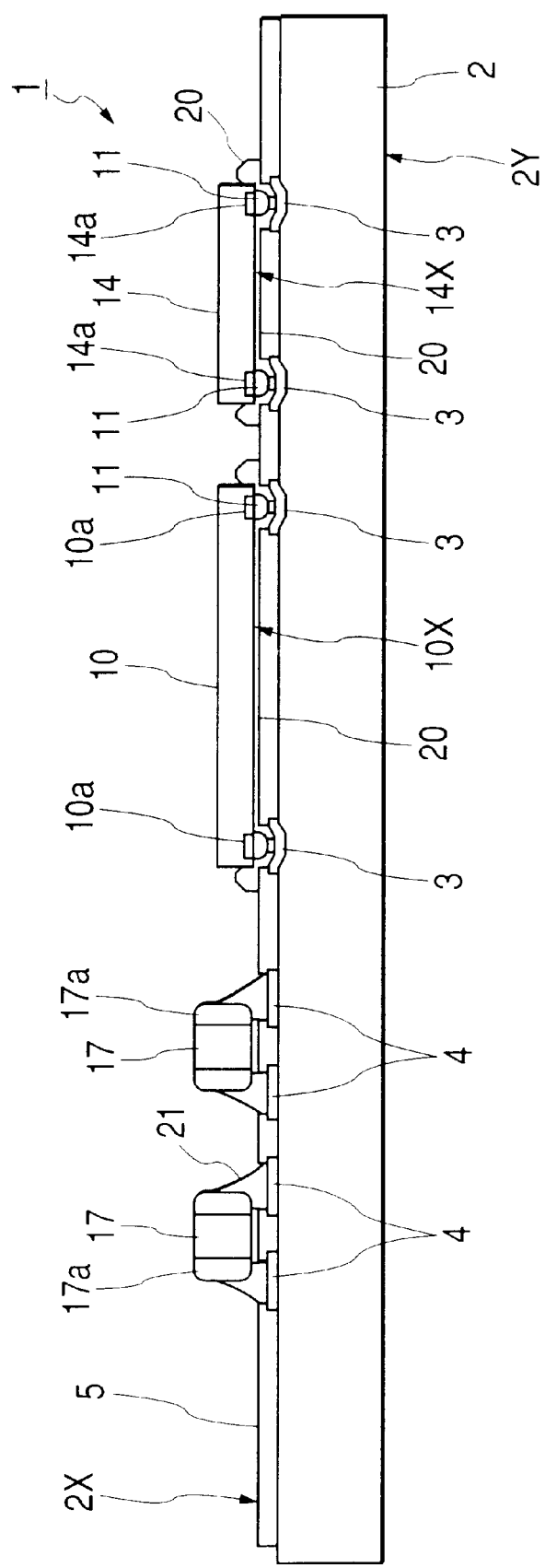
FIG. 15 is a cross-sectional view for describing the manufacture of the MCM showing the second embodiment of the present invention.
Figure 16:
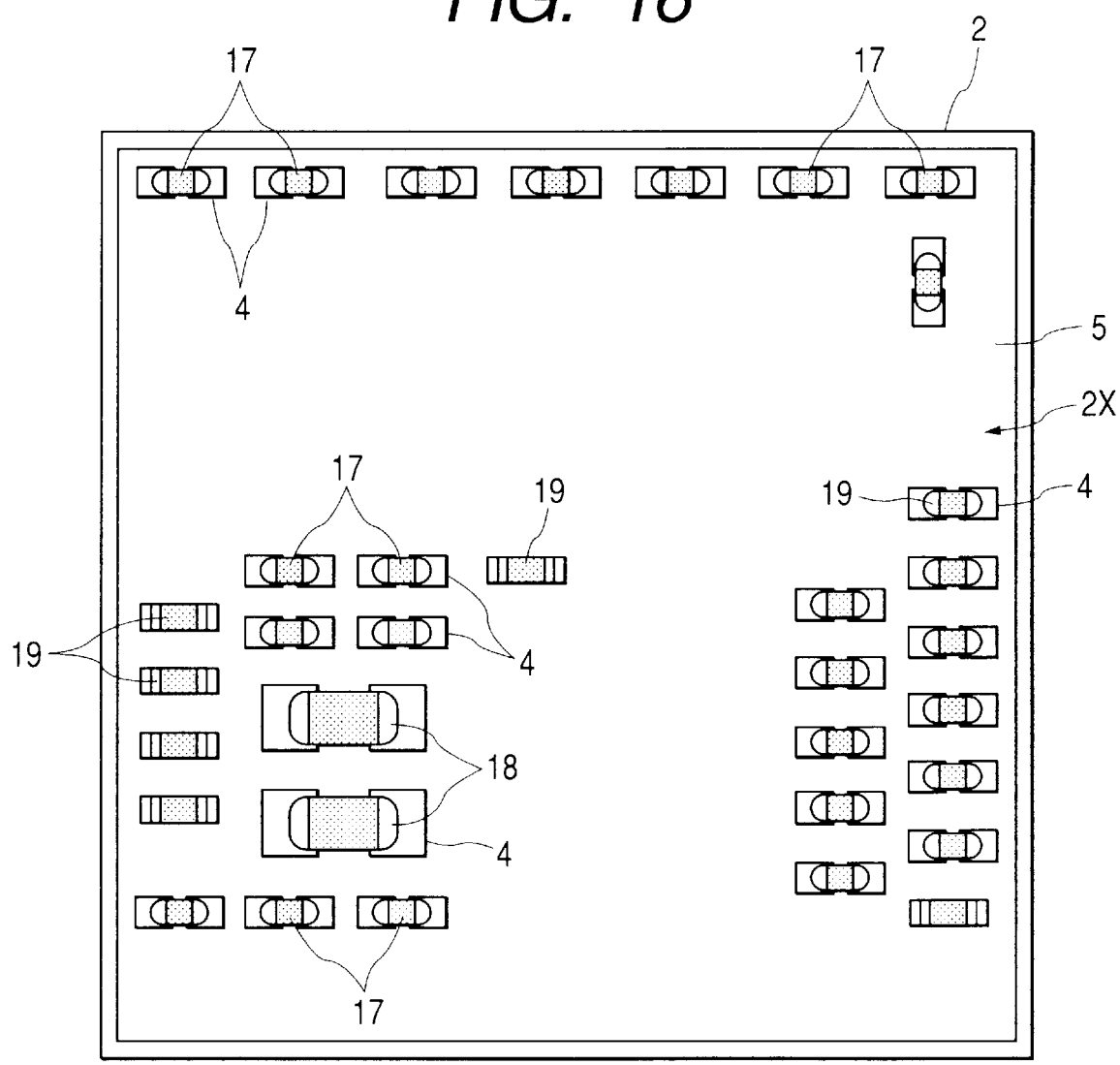
FIG. 16 is a plan view for describing the manufacture of the MCM depicting the second embodiment of the present invention.
Figure 17:
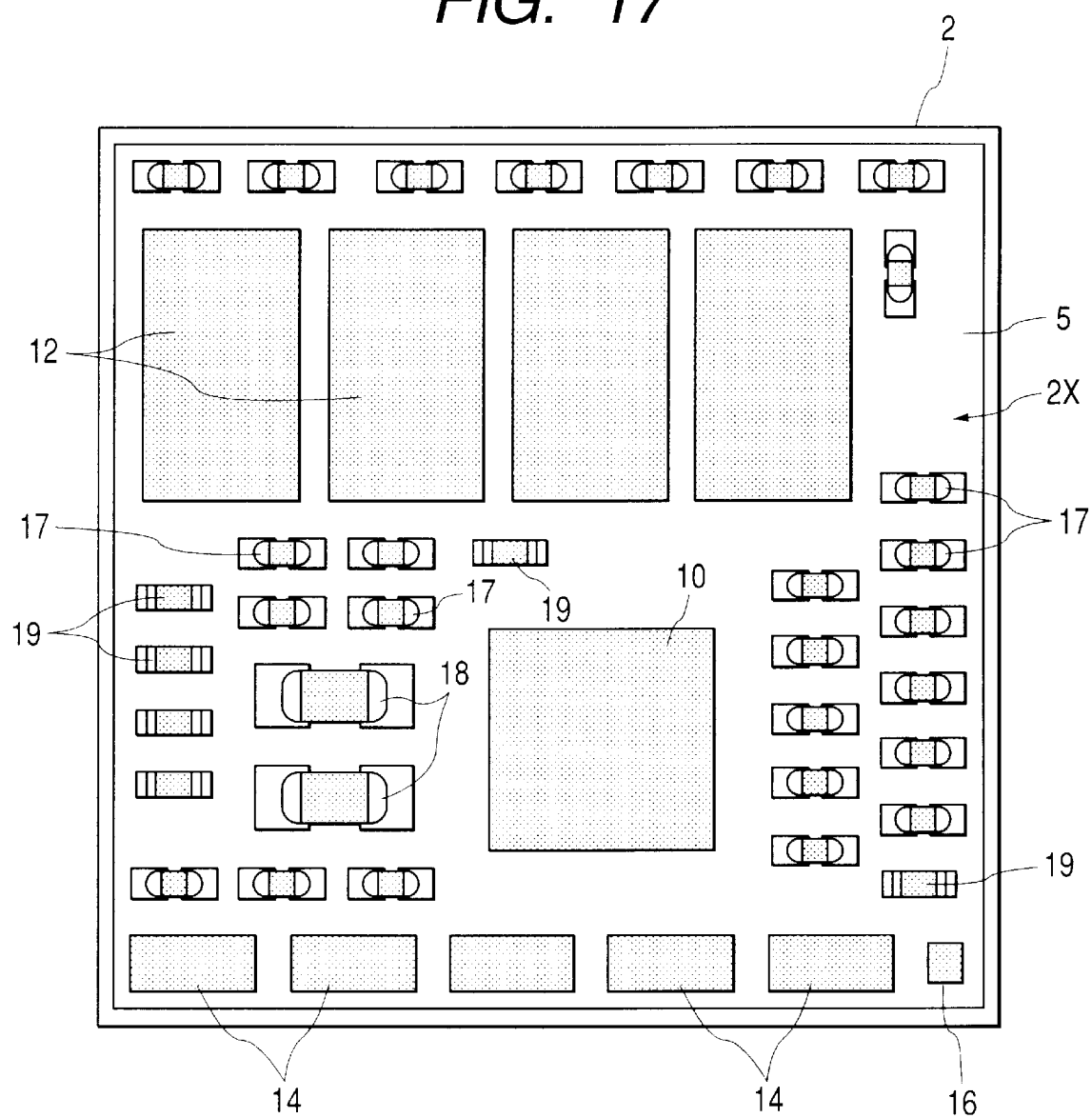
FIG. 17 is a plan view for describing the manufacture of the MCM illustrating the second embodiment of the present invention.

FIGS. 10 through 15 are respectively cross-sectional views for describing the manufacture of the MCM showing the second embodiment of the present invention. FIGS. 16 and 17 are respectively plan views for describing the manufacture of the MCM showing the second embodiment of the present invention. Incidentally, hatching indicative of sections are omitted in FIGS. 10 through 15 to make it easy to see the drawings.

Compression mounted parts or components (control chip 10, memory chips 12, buffer chips 14 and arithmetic or operation chip 16) and soldering mounted parts or components (chip capacitors 17 and 18 and chip resistors 19) are first prepared. Further, a wiring board 2 shown in FIG. 10(A) is prepared. Stud bumps 11 are formed on their corresponding electrode pads of the control chip, 10, memory chips 12, buffer chips 14 and operation chip 16.

Next, a screen mask 28 is placed on one main surface 2X of the wiring board 2. The screen mask 28 has apertures or openings 28A at positions opposite to the respective pads 4 on the wiring board 2.

Next, a semisolid soldering paste material (cream solder) 21A is applied onto one surface of the screen mask 28. As the soldering paste material 21A, a soldering paste material is used which is obtained by mixing and kneading at least fine solder particles and flux. In the present embodiment, a soldering paste material obtained by mixing and kneading solder particles each having a 37 [wt %]lead (Pb)-63 [wt %]tin (Sn) composition, for example is used. Incidentally, the flux may include a pine resin, an active material and an organic solvent or the like.

Next, s shown in FIG. 10(B), a squeegee 29 is slid along one surface of the screen mask 28 to charge the soldering paste material 21A into the openings 28A of the screen mask 28 and remove the extra soldering paste material 21A. The sliding of the squeegee 29 is carried out a few times. Thereafter, the screen mask 28 is removed so that the soldering paste material 21A is supplied onto the respective electrode pads 4 on the wiring board 2 by a screen printing method as shown in FIG. 11(A). The collective supply of the soldering paste material 21A onto the respective electrode pads 4 on the wiring board 2 by the screen printing method in this way is advantageous to the mounting of semiconductor devices such as multi-pin BGA, CSP, QFP and QFN types, etc. as compared with the case in which the soldering paste material 21A is supplied to each individual electrode pads 4 by, for example, a dispense method or the like.

Next, as shown in FIG. 11(B), chip capacitors 17 and 18 and chip resistors 19 are placed on their corresponding electrode pads 4 of one main surface 2X of the wiring board 2 with the soldering paste material 21A interposed therebetween. Afterwards, heat treatment is done to melt the soldering paste material 21A, whereby as shown in FIG. 12(A), the electrode pads 4 on the wiring board 2 and electrodes 17A of the chip capacitors 17 are electrically and mechanically connected to one another by means of solder 21, and the electrode pads 4 on the wiring board 2 and electrodes for the chip capacitors 18 and the chip resistors 19 are also electrically and mechanically connected to one another by the solder 21 in a manner similar to the chip capacitors 17. Thus, as shown in FIG. 16, the soldering electronic components are placed on one main surface of the wiring board 2.

Next, as shown in FIG. 12(B), respective connecting portions 3 of the wiring board 2 are cleaned by plasmas P prior to the mounting of the compression mounted components (plasma cleaning). Thus the plasma cleaning makes it possible to perfectly remove contamination developed due to the composition of flux in the soldering paste material 21A and prevent failures in connections between the stud pads 11 and the respective connecting portions 3 of the wiring board 2.

Next, as shown in FIG. 13(A), a sheet-shaped anisotropic conductive resin film 20A is transferred from a cover tape 23 to its corresponding control chip mounting or loading area of one main surface of the wiring board 2 by means of an applying or sticking tool 25. As shown in FIG. 13(B), the anisotropic conductive resin film 20A is placed on its corresponding control chip mounting area of one main surface 2X of the wiring board 2. As the anisotropic conductive resin film 20A, one is used which is obtained by mixing lots of conductive particles into an epoxy thermosetting resin, for example.

Next, as shown in FIG. 14(A), the control chip 10 is placed on its corresponding control chip mounting area of one main surface 2X of the wiring board 2 with the anisotropic conductive resin film 20A interposed therebetween. The control chip 10 is placed in such a manner that its circuit forming surface 10X is provided face to face with one main surface 2X of the wiring board 2. The control chip 10 is conveyed from a storage tray to the control chip mounting area of one main surface 2X of the wiring board 2 by means of a conveying collet of a chip loader.

Next, as shown in FIG. 14(B), the control chip 10 is thermo-compression bonded by a thermo-compression bonding tool 26B to connect the stud bumps 11 to their corresponding connecting portions 3 of the wiring board 2. Thereafter, its thermo-compression bonded state is held until the anisotropic conductive resin film 20A is cured. The anisotropic conductive resin film 20A is melted once and thereafter cured. Thus, as shown in FIG. 15, the control chip 10 is bonded and fixed to the wiring board 2 by the cured anisotropic conductive resin 20. Electrode pads 10a of the control chip 10 are pressure-welded to their corresponding connecting portions 3 of the wiring board 2 and thereby electrically connected to the connecting portions 3 of the wiring board 2 through the stud bumps 11 and parts of the conductive particles mixed into the anisotropic conductive resin 20 in large quantities.

Next, each of the memory chips 12 is implemented on its corresponding memory chip mounting area of one main surface of the wiring board 2 by a method similar to the control chip 10. Thereafter, each of the buffer chips 14 is mounted on its corresponding buffer chip mounting area of one main surface 2X of the wiring board 2 by the method similar to the control chip 10. Subsequently to it, the operation chip 16 is implemented on its corresponding operation chip mounting area of one main surface 2X of the wiring board 2 by the method similar to the control chip 10. Thus, as shown in FIGS. 15 and 17, compression mounted or packaged components are placed on one main surface 2X of the wiring board 2.

When the soldering electronic component is mounted prior to the compression mounted electronic component, it is necessary to adopt one small to such an extent that a thermo-compression bonding tool 26B no interferes with the soldering electronic component, as the thermo-compression bonding tool 26B. Owing to the use of one wherein a head surface of the thermo-compression bonding tool 26B is smaller than the compression mounted electronic component to be thermo-compression bonded in particular, the thermo-compression bonding tool 26B can be prevented from being contaminated by the anisotropic conductive resin 20 that has extended out toward the periphery of the compression mounted electronic component.

Further, since the upper portions of all the stud bumps are covered with the head surface of the thermo-compression bonding tool 26B where the head surface of the thermo-compression bonding tool 26B is smaller than the compression mounted electronic component, the periphery of the head surface of the thermo-compression bonding tool 26B is set so as to be located between the stud bumps and the periphery of the compression mounted electronic component in an on-plane layout. Consequently, all of heat and pressure applied by the thermo-compression bonding tool 26B can more uniformly be applied to all the stud bumps.

According to the present embodiment as described above, the following advantageous effect are obtained.

(1) Since the soldering paste material 21A can be supplied according to the normal screen printing method owing to the mounting of the soldering electronic components prior to the compression mounted electronic components, the MCM can be downsized as compared with the case where the soldering paste material 21A is supplied by the screen printing method using the embossed mask. Further, the productivity of the MCM can be improved as compared with the case in which the soldering paste material 21A is supplied by the dispenser method.

(2) Owing to the use of the head surface of the thermo-compression bonding tool 26B, which is smaller than each compression mounted electronic component to be thermo-compression bonded in the embodiment wherein the soldering electronic components are mounted prior to the compression mounted electronic component, the thermo-compression bonding tool 26B can be prevented from being contaminated by the anisotropic conductive resin 20 that has extended out toward the periphery of the compression mounted electronic component. As a result, the productivity of the MCM can be improved.

(3) In the embodiment in which the soldering electronic components are implemented prior to the compression mounted electronic components, the periphery of the head surface of the thermo-compression bonding tool 26B is set so as to be located between the stud bumps and each of the compression mounted electronic components. Consequently, all of heat and pressure applied by the thermo-compression bonding tool 26B can more uniformly be applied to all the stud bumps.

(4) Since the connecting portion 3 of the wiring board 2, which has been contaminated by the flux or the like of the soldering paste material 21A can be cleaned by execution of plasma screening before the mounting of each compression mounted electronic component, it is possible to control or restrain failures in electrical connections between the compression mounted electronic component and the connecting portions 3 of the wiring board 2. As a result, the enhancement of yields of the MCM can be achieved.

(5) One smaller than each compression mounted electronic component to be thermo-compression bonded is used as the thermo-compression bonding tool to thereby make it possible to avoid the contact between the already-mounted soldering electronic component and the thermo-compression bonding head.

Incidentally, the first and second embodiments respectively have described the example in which the stud bumps are used as the protruded electrodes formed on the electrode pads of the semiconductor chip. However, the present invention is not limited to the above. For instance, solder bumps each having a Pb-Sn composition may be used. However, solder bumps are used, each of which comprises a material whose melting point is higher than a solder melting temperature at the mounting of each soldering electronic component and a thermo-compression bonding temperature at the mounting of each compression mounted electronic component.

While the first and second embodiments respectively have described the example in which the protruded electrodes interposed between the electrode pads of the compression mounted electronic components and their corresponding connecting portions of the wiring board are formed on their corresponding electrode pads of the compression mounted electronic component in advance, the protruded electrodes may be formed on their connecting portions of the wiring board in advance.

Further, while the first and second embodiments respectively have described the example in which the sheet-like conductive resin is used as the bonding resin for bonding and fixing each compression mounted electronic component to the wiring board. However, the present invention is not limited to the above. For example, a paste-like anisotropic conductive resin (ACP) and a sheet-like non-conductive resin (NCF) may be used.

As a third embodiment, a description will be made of an MCM to which a radiator is attached.

Figure 18:
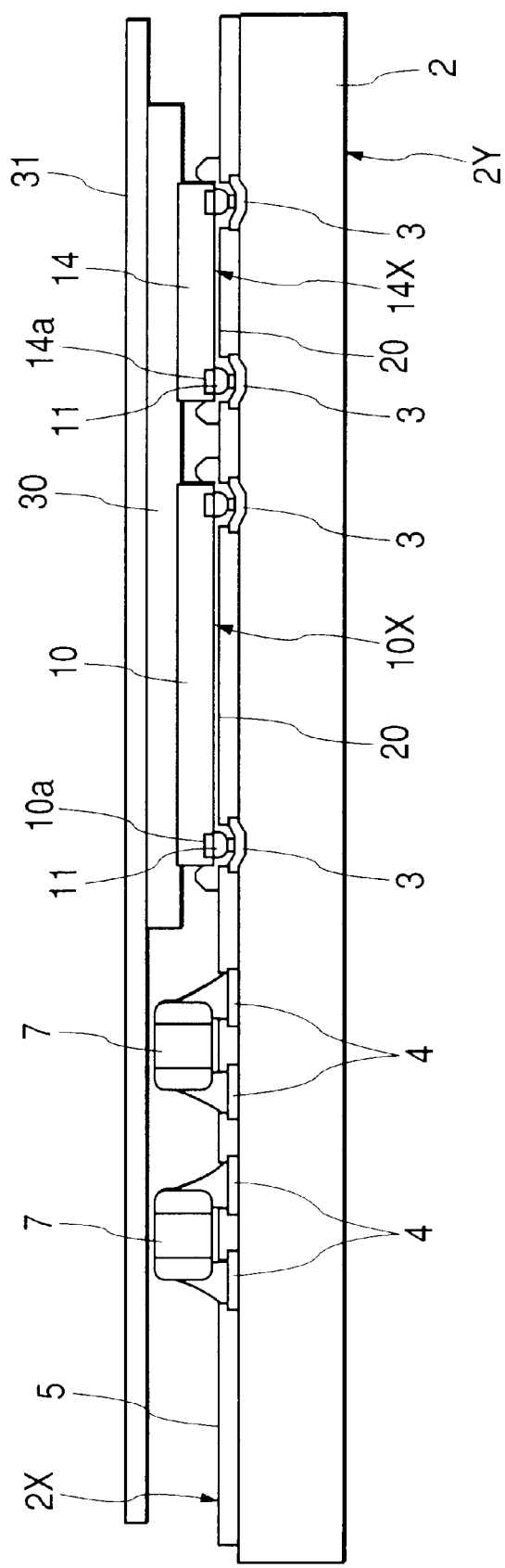
FIG. 18 is a cross-sectional view showing a schematic configuration of an MCM illustrative of a third embodiment of the present invention.
Figure 19:
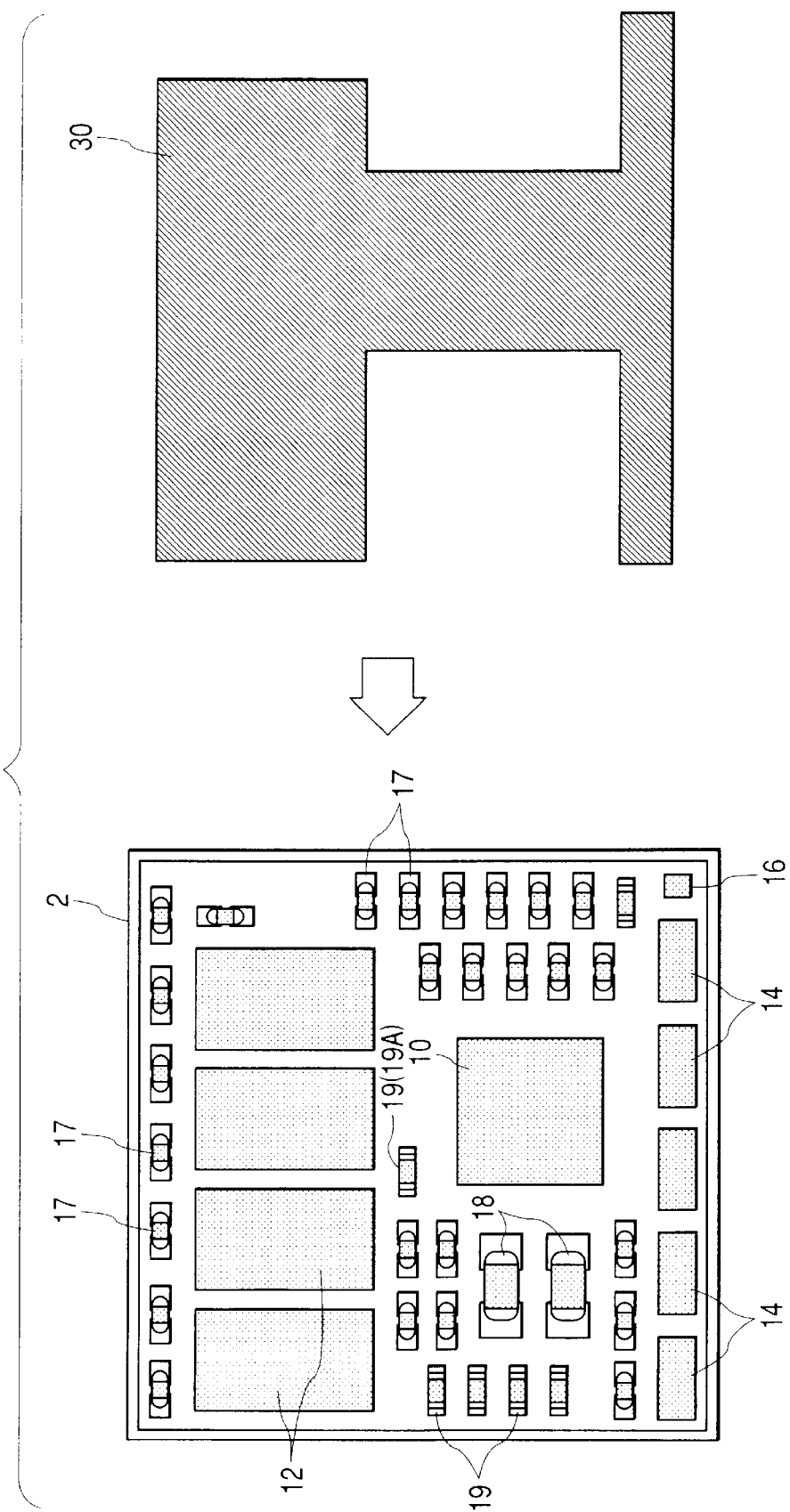
FIG. 19 is a developed view of the MCM shown in FIG. 18.
Figure 20:
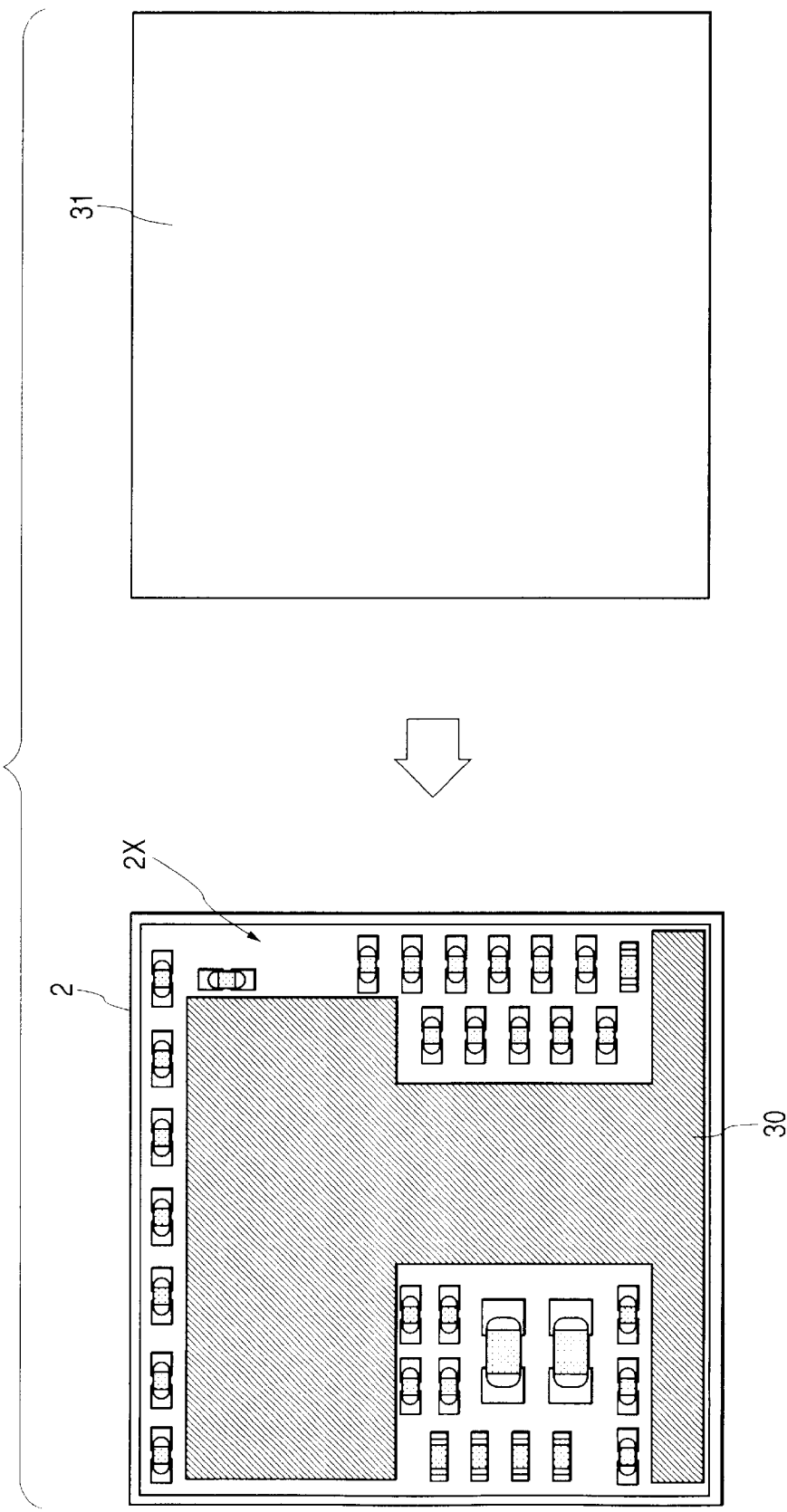
FIG. 20 is a developed view of the MCM shown in FIG. 18.

FIG. 18 is a cross-sectional view of the MCM showing the third embodiment of the present invention, and FIGS. 19 and 20 are respectively developed views of the MCM shown in FIG. 18. Incidentally, hatching indicative of a section in FIG. 18 is omitted to make it easy to see the drawing.

As shown in FIGS. 18 through 20, the MCM according to the present embodiment is configured so as to have a thermal conductive sheet 30 and a radiator 31. The thermal conductive sheet 30 is formed of elastomeric silicon rubber, for example, and the radiator 31 is formed of a plane plate made up of aluminum, for example.

Figure 21:
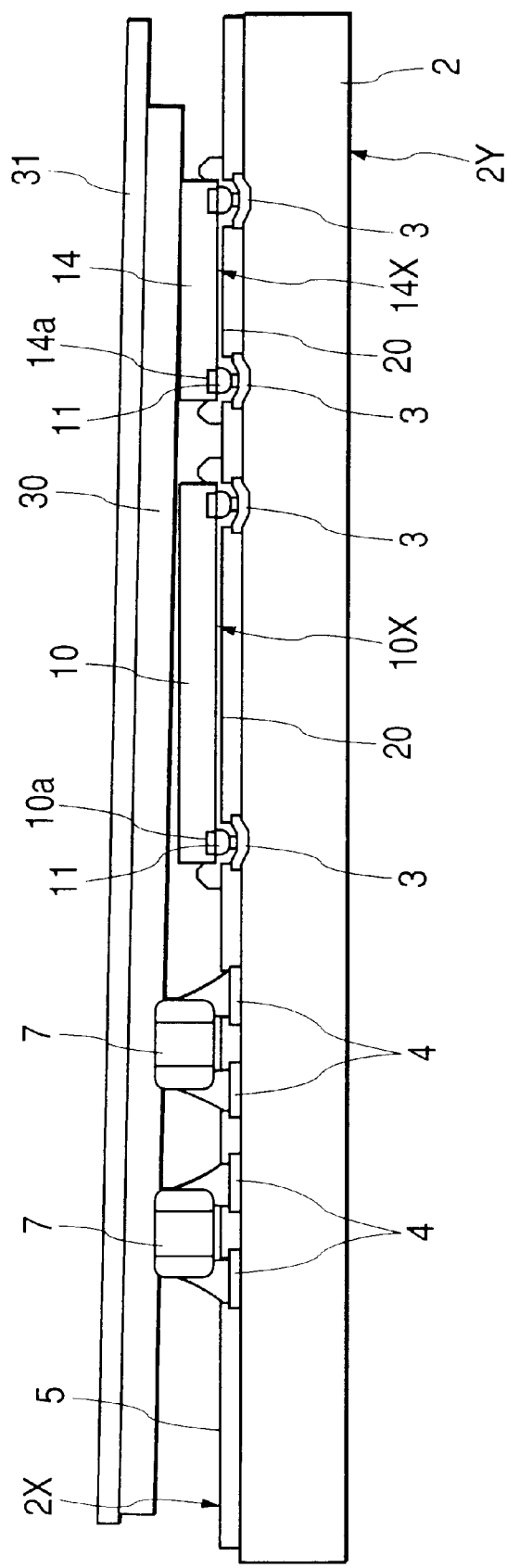
FIG. 21 is a cross-sectional view of an MCM to which the present invention is not applied.

The thermal conductive sheet 30 has a shape patterned so as to make contact with the back of each compression mounted electronic component and not to make contact with chip capacitors 17 and 18. The thermal conductive sheet 30 having such a shape is mounted to the back of each compression mounted electronic component, and the radiator 31 is mounted to the thermal conductive sheet 30, whereby the difference in vertical interval between the compression mounted electronic component and each of the chip capacitors 17 and 18 can be complemented with the thickness of the thermal conductive sheet 30. Therefore, the chip capacitors 17 and 18 high in height do not interfere with the contact between the compression mounted electronic component and the thermal conductive sheet 30 as shown in FIG. 21. As a result, heat generated upon the operation of the compression mounted electronic component can efficiently be transferred to the thermal conductive sheet 30, and hence the dissipation of the MCM can be improved.

The radiator 31 is formed so as to cover a plurality of compression mounted electronic components and a plurality of soldering electronic components, and in a plane size larger than that of the thermal conductive sheet 30, whereby the radiator 31 increases in area, thus making it possible to achieve a further improvement in dissipation of the MCM.

Further, the thermal conductive sheet 30 has such a shape as to make contact with each of chip resistors 19A. This is because the heights of the control chip 10 and each memory chip 12 placed on both sides of the chip resistor 19A are 0.4 [mm], whereas the height of the chip resistor 19A is 0.45 [mm], and the difference in vertical height therebetween is equivalent to such an extent as that it is capable of being accommodated according to the deformation of the thermal conductive sheet 30. Owing to the selective placement of ones relatively low in post-mounting height even in soldering components within an applying or sticking area of the thermal conductive sheet 30 in this way, the area between the adjacent compression mounted electronic components can also be effectively utilized, and the MCM can be downsized.

While the invention made above by the present inventors has been described specifically by the illustrated embodiments, the present invention is not limited to the embodiments. It is needless to say that various changes can be made thereto within the scope not departing from the substance thereof.

Advantageous effects obtained by typical ones of the inventions disclosed in the present application will be described in brief as follows:

According to the present invention, the productivity of an electronic device can be improved.

According to the present invention, an electronic device can be brought into less size.

According to the present invention, the dissipation of an electronic device can be enhanced.

What is claimed is:

1. A method of manufacturing an electronic device including:
   a wiring board having a main surface and a rear surface opposed to the main surface, and a plurality of external terminals arranged on the rear surface;
   a first electronic component mounted on the main surface of the wiring board by being thermo-compression bonded by means of a thermo-compression bonding tool with an adhesive resin interposed between a first area of the main surface of the wiring board and said first electronic component; and
   a second electronic component mounted on a second area different from the first area of the main surface of the wiring board by melting a soldering paste material, said second electronic component being higher than said first electronic component in post-mounting height,
   said method comprising the step of:
      mounting said first electronic component before the mounting of said second electronic component.

2. The method according to claim 1, wherein the adhesive resin is a thermosetting resin.

3. The method according to claim 1, wherein a temperature of the thermo-compression bonding tool at a time when the first electronic component is thermo-compression bonded, is higher than a melting point of the soldering paste material.

4. The method according to claim 1,
wherein said first electronic component is an active part with circuits built therein, and
wherein said second electronic component is a passive part.

5. A method of manufacturing an electronic device, comprising the following steps:
providing a wiring board having a main surface and a rear surface opposed to the main surface, and a plurality of electrodes for external terminal arranged on the rear surface;
a first step of placing a first electronic component on a first area of the main surface of the wiring board with an adhesive resin interposed therebetween, thereafter thermo-compression bonding the first electronic component by a thermo-compression bonding tool, bonding and fixing the first electronic component to the first area of the main surface of the wiring board, and electrically connecting first connecting portions provided in the first area of the main surface of the wiring board and electrode pads provided in the first electronic component by protruded electrodes interposed therebetween, respectively; and
a second step of supplying a soldering paste material to second connecting portions provided in a second area different from the first area of the main surface of the wiring board, thereafter placing electrodes of a second electronic component on the second connecting portions with the soldering paste material interposed therebetween, respectively, and subsequently melting the soldering paste material to thereby electrically connect the second connecting portions of the wiring board and the electrodes of the second electronic component respectively,
wherein said first step is executed before the execution of said second step.

6. The method according to claim 5, wherein said second electronic component has a height extending upward from the main surface of the wiring board which is higher than that of the first electronic component.

7. The method according to claim 5, wherein said adhesive resin is a thermosetting resin.

8. The method according to claim 5, wherein a temperature of the thermo-compression bonding tool at a time when the first electronic component is thermo-compression bonded, is higher than a melting point of the soldering paste material.

9. The method according to claim 5, wherein the supplying of the soldering paste material is carried out with a dispenser.

* * * * *